(12) United States Patent
Nakahigashi et al.

(10) Patent No.: US 6,893,720 B1
(45) Date of Patent: May 17, 2005

(54) OBJECT COATED WITH CARBON FILM AND METHOD OF MANUFACTURING THE SAME

(75) Inventors: Takahiro Nakahigashi, Kyoto (JP); Akira Doi, Ikeda (JP); Yoshihiro Izumi, Kyoto (JP); Hajime Kuwahara, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/589,225

(22) Filed: Jun. 8, 2000

Related U.S. Application Data

(62) Division of application No. 08/884,554, filed on Jun. 27, 1997, now Pat. No. 6,136,386.

(51) Int. Cl.$^7$ .................................. B32B 9/00
(52) U.S. Cl. .................. 428/408; 138/137; 138/145; 188/378; 188/381; 92/49; 92/96; 92/103 R; 417/44.9; 15/256.5; 277/590
(58) Field of Search .................. 428/408, 402; 138/137, 145; 188/378, 381; 92/49, 96, 103 R; 417/44.9; 15/256.5; 277/590

(56) References Cited

U.S. PATENT DOCUMENTS

| | | | | |
|---|---|---|---|---|
| 4,981,717 A | * | 1/1991 | Thaler | 427/53.1 |
| 4,996,079 A | * | 2/1991 | Itoh | 427/39 |
| 5,013,579 A | | 5/1991 | Yamazaki | |
| 5,039,548 A | | 8/1991 | Hirose et al. | 427/536 |
| 5,230,931 A | * | 7/1993 | Yamazaki et al. | |
| 5,368,937 A | | 11/1994 | Itoh | |
| 5,487,810 A | | 1/1996 | Thurm et al. | |
| 5,521,351 A | * | 5/1996 | Mahoney | 219/121.59 |
| 5,562,952 A | * | 10/1996 | Nakahigashi et al. | |
| 5,618,619 A | * | 4/1997 | Petrmichl et al. | |
| 5,740,941 A | * | 4/1998 | Lemelson | |

FOREIGN PATENT DOCUMENTS

| | | | |
|---|---|---|---|
| CA | 2033568 | | 1/1991 |
| CN | 1035855 A | | 9/1989 |
| EP | 0 206 145 | | 12/1986 |
| EP | 330 524 | | 8/1989 |
| EP | 0 653 501 A1 | | 5/1995 |
| EP | 0675303 | * | 10/1995 |
| JP | 63-169379 | | 7/1988 |
| JP | 63-217303 | | 9/1988 |
| JP | 64-090484 | | 4/1989 |
| JP | 1-2948673 | | 11/1989 |
| JP | 2-80571 | | 3/1990 |
| JP | 2-166283 | | 6/1990 |
| JP | 02197401 | * | 8/1990 |
| JP | 03-130363 A | | 6/1991 |
| JP | 3-189613 | | 8/1991 |

(Continued)

OTHER PUBLICATIONS

English abstract of JP 04041672, published Feb. 1992.*
Athwal et al., Diamond and Related Materials, vol. 2, pp. 1483–1489, Nov. 1, 1993.
Derwent Abstract No. AN 1991–204818, 1991; Derwent Abstract No. AN 1992–100016, 1992.
Canadian Office Action dated Oct. 17, 2003.

*Primary Examiner*—Archene Turner
(74) *Attorney, Agent, or Firm*—Arent Fox

(57) ABSTRACT

An object such as an automobile part, an image forming apparatus part, a bicycle part, other machine parts, a sport article or its part, a toy or its part, or a rain article or its part has a portion to be in contact with a contact object. The contact portion is made of at least one kind of material selected from a group including polymer material such as resin or rubber as well as glass, and the contact portion has a surface entirely or partially coated with a carbon film (typically, a DLC film) having a wear resistance as well as at least one of a lubricity, a water repellency and a gas barrier property. The carbon film is formed on the object with a good adhesion.

4 Claims, 11 Drawing Sheets

FOREIGN PATENT DOCUMENTS

| | | | |
|---|---|---|---|
| JP | 3-240959 | | 10/1991 |
| JP | 04-041672 | | 2/1992 |
| JP | 05296864 | * | 4/1992 |
| JP | 04126172 | * | 5/1992 |
| JP | 5-13394 | | 1/1993 |
| JP | 5-41368 | | 2/1993 |
| JP | 5-117087 | | 5/1993 |
| JP | 05-140730 | | 6/1993 |
| JP | 5-237709 | | 9/1993 |
| JP | 6-291048 | | 10/1994 |
| JP | 06-341445 | | 12/1994 |
| JP | 7-15147 | | 2/1995 |
| JP | 7-187862 | | 7/1995 |
| JP | 7-278822 | | 10/1995 |
| JP | 03-053116 | | 2/1996 |
| JP | 8-74032 | | 3/1996 |
| JP | 9-12750 | | 1/1997 |
| JP | 9-78226 | | 3/1997 |
| JP | 9-95784 | | 4/1997 |
| JP | 9-124807 | | 5/1997 |
| JP | 9-125253 | | 5/1997 |
| JP | 09-160457 | | 6/1997 |
| JP | 9-173192 | | 7/1997 |
| JP | 09327639 | * | 12/1997 |
| JP | 10035418 | * | 2/1998 |
| JP | 03-213870 | | 9/2001 |
| WO | WO95-26879 | | 10/1995 |
| WO | WO97/10688 | | 3/1997 |

* cited by examiner

OBJECT COATED WITH CARBON FILM AND METHOD OF MANUFACTURING THE SAME

This is a divisional application for U.S. patent application Ser. No. 08/884,554, filed Jun. 27, 1997, now U.S. Pat. No. 6,136,386 the disclosure of which is hereby incorporated by reference.

BACKGROUND OF THE INVENTION

1. Field of the Invention

The present invention relates to objects or articles such as machine parts, structure component members, pipes for water supply and others, various sheets, toys or their parts, sporting goods or their parts, rain goods or their parts, and diaphragms for diaphragm pumps, e.g., for artificial hearts, and particularly relates to an object having a portion, which is to be in contact with another object (e.g., another article, part, fluid or ground) and is entirely or partially made of at least one kind of material selected from a group including polymer material such as resin or rubber as well as glass.

2. Description of the Related Art

Polymer material such as organic polymer material (e.g., resin and rubber) are now utilized in various fields. For example, such material is used for partially or entirely forming objects such as machine parts, structure component members, pipes, sheets, toys or their parts, sporting goods (or articles) or their parts, rain goods (or articles) or their parts, or diaphragms for diaphragm pumps, e.g., for artificial hearts. The glass is also used for window panes of automobiles and others.

The object having a portion which is to be in contact with another object and is partially or entirely made of polymer material is generally required or desired to have such a feature that the portion to be in contact with another object and made of polymer material has an improved sliding property with respect to another object and/or can suppress wear and deterioration due to friction. For these purposes, lubricant oil or grease is applied to the portion, or the portion is impregnated with lubricant oil. Also, the portion may be made of material containing oil added thereto.

Also, the portion made of polymer material may be coated with a film made of fluorine-contained resin (e.g., polytetrafluorethylene) having a good lubricity.

If transmission of oxygen, water vapor or another gas is to be suppressed at the portion made of polymer material, a gas barrier resin film may be formed at the surface of the portion, for example, by applying resin thereto.

If a water repellency is required at the portion made of polymer material, a water-repellent resin film may be formed at the surface of the portion by applying resin thereto.

The above processing may not be employed in some cases.

However, a problem arise in the method in which lubricating oil or grease is used for improving sliding property and/or suppressing wear and deterioration due to friction, and particularly oil or grease is applied to the surface of the portion made of polymer material. More specifically, in this method, relatively good characteristics are achieved at the start of use. However, oil or grease on the surface is dispersed, absorbed or removed with time, so that the sliding property is impaired, and wear and deterioration of the surface are liable to occur. According to the method in which the portion made of polymer material is impregnated with oil or is made of material containing oil, relatively good characteristics can be achieved at the start of use. However, the oil contained at the surface portion is absorbed into another object (i.e., contact object) with time. By this or other reasons, the amount of oil spreading over the surface decreases, so that the sliding property lowers, and wear and deterioration of the surface are liable to occur.

Even if oil or grease is present on the surface of the portion made of polymer material, wear and deterioration due to friction with the contact object cannot be sufficiently suppressed if the contact object in contact with the above portion is made of, e.g., metal and therefore is hard.

According to the method in which a fluorine-contained resin film is formed at the surface of the portion made of polymer material, wear and deterioration of the surface are liable to occur due to friction with another object made of hard material such as metal.

According to the method in which a resin film having a gas barrier property is formed at the portion made of polymer material, a good sliding property with respect to another object cannot be maintained for a long term, because the film surface is made of resin. Further, wear and deterioration of the surface are liable to occur due to friction with another object made of hard material, such as metal.

Similar problems arise in the method in which the portion made of polymer material is coated with a water-repellant resin film.

If any one of the above methods is not employed, problems relating to wear resistance arise from the start of use.

The foregoing will now be discussed more in detail. Various kinds of machine parts such as gears and rollers, structure component members such as walls and floors, toys and their parts such as gears and sliding parts, and various kinds of pipes and sheets may have such structures that each object is partially or entirely made of polymer material such as resin or rubber. The object and particularly a portion thereof made of polymer material for contact with another object may be processed or formed as follows for improving a sliding property with respect to another object (contact object) and preventing wear and deterioration due to contact with the contact object. According to the above processing or formation, oil or grease may be applied to the surface, or the object may be impregnated with oil. Also, the portion may be made of material containing oil added thereto.

For a pipe requiring a gas barrier property, the outer surface of the pipe may be coated with a resin film having a gas barrier property for suppressing transmission of oxygen, water vapor and other gases.

A sheet may be made of material impregnated with oil or containing oil added thereto for improving a sliding property with respect to a contact surface of a sheet support member, object, ground, floor or the like supporting or covered with the sheet, and thereby preventing wear and deterioration due to contact. This method is also employed for preventing smearing of the sheet by water droplets, rain, mud and others.

If oil or grease is employed, the amount of oil or grease at the surface of the portion made of polymer material decreases with use and therefore the sliding property is impaired as already described, so that wear and deterioration of the surface are liable to occur. Even in the case where oil is present at the portion made of polymer material, wear and deterioration due to friction with a contact object cannot be sufficiently suppressed if the contact object in contact with the portion is made of hard material such as metal.

Likewise, a pipe coated with a resin film having a gas barrier property cannot maintain a good sliding property with respect to a contact object for a long term, because the surface is made of resin. Also, wear and deterioration are liable to occur at the surface due to friction with the contact object made of hard material such as metal.

In a sheet impregnated with oil or made of material containing oil added thereto, wear and deterioration are liable to occur at the surface thereof due to contact with a support member of the sheet, a contact object laid on the sheet, a contact object to be covered by the sheet, the ground or the like. This results in lowering of the sliding property and water repellency. As a result of lowering of the water repellency, water droplets, raindrops, mud and others are liable to adhere thereto.

For automobile parts, a polymer material such as rubber or resin, is widely used as a material for vibration dampers, hoses, tires and sealing members.

Vibration dampers and hoses for automobiles, which have surfaces made of polymer material, are required or desired to have an improved sliding property with respect to other objects (i.e., contact objects). Also, it is also required or desired to prevent wear due to contact with contact objects as well as deterioration. For these purposes, grease is applied to the surface, or the damper is made of material containing oil added thereto.

Hoses for automobiles may be coated with resin films having a gas barrier property for suppressing transmission of oxygen, water vapor or other gases. Automobile tires are required to suppress wear and deterioration due to contact with wheels, and are also required to suppress deterioration due to external light and exhaust gas. For these purposes, grease or wax may be applied to the surface, or the tire may be made of material containing oil added thereto.

Automobile sealing members are desired to prevent wear and deterioration due to contact with contact objects in contact with the seal members. For this purpose, grease may be applied to the surface, or oil may be added to the material thereof.

According to the method in which grease or wax is applied to the surfaces of the vibration dampers, hoses, tires and seal members for automobiles, desired characteristics such as a good sliding property with respect to the contact object may be obtained at the start of use. However, the grease or wax on the surface may be dispersed, absorbed to other objects or removed with time, which results in wear and deterioration of the surface as well as lowering of a sliding property.

According to the method in which the vibration dampers, hoses, tires and seal members for automobiles are made of material containing oil added thereto, desired characteristics such as a good sliding property may be obtained at the start of use. However, the oil contained in the surface portion decreases in amount due to absorption into other objects with time, which results in wear and deterioration of the surfaces as well as lowering of a sliding property.

Automobile vibration dampers are usually arranged to be in contact with objects made of metal. Automobile hoses are often fixed by metal fasteners. Automobile tires are usually in contact with wheels made of metal. Automobile seal members are usually in contact with pipes or the like made of metal. In these cases, the method of employing grease applied to the surface and the method of adding oil to the material cannot sufficiently prevent wear and deterioration of the surface.

The automobile hoses coated with resin films having a gas barrier property cannot maintain a good sliding property with respect to other objects for a long term, because their surfaces are made of resin. Also, wear and deterioration are liable to occur due to friction with contact objects made of hard material such as metal.

Automobile tires may also suffer from another problem. More specifically, external water vapor is liable to move into the tire. If the tire includes an inner tube, the water vapor is liable to deteriorate the tube. In rain, water and mud are liable to remain in tire grooves at the outer surface.

Automobile diaphragms are specifically used in a diaphragm pump for window washer fluid, a diaphragm pump used in a fuel supply system and a diaphragm valve, and are generally made of polymer material such as rubber or resin. For automobile valve parts, it has been proposed to use resin having a relatively good heat resistance such as polyimide resin or a polytetrafluorethylene resin. Automobile window panes are brought into contact with wiper blades for wiping raindrops. Automobile bodies are usually coated with decorative paint films made of resin. However, these parts are not particularly treated to have good wear resistance and others.

However, the automobile diaphragm made of polymer material suffers from problems that wear and deterioration are liable to occur due to contact with a part or the like which is made of metal and is employed for fixing the diaphragm, and that fluid such as liquid handled by the diaphragms is liable to adhere to the diaphragm.

Automobile valve parts made of resin may suffer from wear, deterioration and lowering of a sliding property due to contact between valves and valve seats.

Automobile window panes may suffer from such problems that a wiper blade cannot sufficiently remove raindrops on the pane, and that raindrops start to remain on the pane immediately after wiping and therefore cannot be removed sufficiently. Further, the panes may be scratched by sand dust in a wind.

Automobile bodies may suffer from such problems that decorative paint films are liable to be peeled off due to contact with other objects, and that a water repellency is impaired and therefore dust adhered to the paint film cannot be removed easily.

For parts of image forming apparatuses, polymer material such as resin or rubber is widely used. For example, thermoplastic resin is widely used for various kinds of frames, record member trays, gears, bearings and others. Thermosetting resin is used for gears, bearings and others. Rubber is used in surface portions of various rollers such as a developing roller in a developing device, fixing and pressure rollers in a fixing device for fixing a toner image on the record member under heat and pressure, an application roller for applying a release agent to the fixing roller, a transfer roller for transferring a toner image produced by developing a latent image on an electrostatic latent image carrier onto a paper sheet, and a cleaning roller for removing toner remaining on the electrostatic latent image carrier. Also, rubber is used as a surface material of rotary parts, such as a transfer belt which may be employed as transfer means, and other belts.

These image forming apparatus parts which have surfaces made of polymer material do not have a sufficient sliding property with respect to contact objects. Therefore, in order to improve a sliding property of resin parts such as gears and bearings, which require a sufficient sliding property as described before, grease may be applied to the surfaces, or they may be made of material containing oil added thereto. For parts such as a roller and a belt, of which surface portions are primarily made of rubber, surfaces thereof may be coated with films of fluorine-containing resin (e.g., polytetrafluorethylene) having a good sliding property, or they may be made of rubber containing oil added thereto.

However, according to the method in which grease is applied to the surface of the sliding part such as a gear or a bearing, the amount of grease on the surface gradually decreases with use, and therefore the sliding property lowers as already described. According to the method in which the forming apparatus part is made of material containing oil added thereto, the amount of oil at the surface gradually decreases with use, and therefore the sliding property lowers as already described. In the latter case, the fixing device parts or the like may suffer from such a problem that only limited kinds of oil can be used because the fixing devices are usually heated to about 200° C. for fixing the toner image on the sheet.

According to the method in which parts are coated with fluorine-containing resin films, base members of the image forming apparatus parts can be made of only limited kinds of material, because baking or sticking of the films must be performed at a temperature from 360 to 400° C. for 20 to 40 minutes.

Sporting goods or articles, bicycle parts or the like are made of polymer material such as rubber or resin in many cases. More specifically, rubber is used, for example, in sealing members of mountaineering and camping tents, balls, sport shoes and bicycle tires, and particularly is used as their major material or surface material. Resin is used in frames and guts of tennis and badminton rackets, golf clubs, sport shoes, disks used as a substitute for spokes of bicycle wheels, rims of bicycle wheels or the like, and particularly is used as their major material or surface material.

Among these objects, the objects having surfaces made of rubber may be required to have a good sliding property with other objects for preventing wear and deterioration due to contact with other objects or to have an improved water repellency. For these purposes, grease or wax may be applied to the surface, or oil may be added into the material of the object. These measures are not employed in objects having surfaces made of resin.

Polymer material such as rubber or resin is usually used in rain shoes, umbrellas, raincoats or other rain articles.

Diaphragms employed in diaphragm pumps for artificial hearts or the like are made of polymer material such as silicon rubber.

However, according to the above method for the sports goods and bicycle parts, and particularly the method in which grease or wax is applied to the surfaces of the foregoing sealing members, balls, bicycle tires or the like, the amount of grease or wax on the surface gradually decreases with use, and therefore the sliding property lowers as already described, so that wear and deterioration of the surface are liable to occur. Also, the water repellency is liable to lower, and therefore adhesion of smear is liable to occur. According to the method in which the object is made of material containing oil added thereto, the amount of oil at the surface gradually decreases with use, and therefore similar problems arise as already described.

Friction occurs, for example, between a seal member, which provides sealing between a tent sheet and a pole, and the metal pole. Also, friction occurs between a ball and the ground, bat, racket or the like. Friction further occurs between a bicycle tire and a metal rim when air is supplied or discharged from the tire. The friction thus occurred tends to wear or deteriorate the surface, which impairs a sliding property and/or a water repellency. Lowering of the water repellency results in a problem that a carry of a golf ball or the like decreases.

Similar problems arise in sport goods and their parts having surfaces made of resin. More specifically, wear and deterioration of the surface thereof are liable to occur, and therefore a sliding property and water repellency are impaired due to contact of the rackets and golf clubs with other objects, mutual contact between guts made of resin, and contact between rims and tires.

A low water repellency of the bicycle disks cannot sufficiently suppress adhesion of raindrops in the rain, which may prevent high-speed cycling.

Rain goods made of rubber or resin are liable to be damaged by contact with other objects. Also, raindrops and mud adhered onto the rain articles cannot be easily removed due to an insufficient water repellency.

The diaphragm made of polymer material suffers from such problems that wear and deterioration are liable to occur due to contact with a fastener or the like, and fluid such as liquid or the like handled by the diaphragm is liable to adhere and remain on the diaphragm.

SUMMARY OF THE INVENTION

Accordingly, an objective of the invention is to provide an object having a portion to be in contact with another object as well as a method of manufacturing the same. The portion is entirely or partially made of at least one kind of material selected from a group including polymer material, such as resin and rubber, as well as glass, and has at least good wear resistance.

Another objective of the invention is to provide an object having a portion to be in contact with another object as well as a method of manufacturing the same. The portion is entirely or partially made of at least one kind of material selected from a group including polymer material such as resin and rubber as well as glass, and has good wear resistance as well as good sliding performance, good water repellency and/or a gas barrier property.

Still another objective of the invention is to provide an object having a portion to be in contact with another object as well as a method of manufacturing the same. The portion is entirely or partially made of at least one kind of material selected from a group including polymer material such as resin and rubber, as well as glass, and has a good sliding property with respect to another object as well as good wear resistance. The object having the above portion is a machine part, such as an automobile vibration damper, an automobile valve member, an automobile seal member, a part of an image forming apparatus, a bicycle part, a sewing machine part such as a thread guide, or another machine part. Also, the object may be a structure component member such as a wall member or a floor member, a toy or its part.

Yet another objective of the invention is to provide an object having a portion to be in contact with another object as well as a method of manufacturing the same. The portion is entirely or partially made of polymer material, such as resin and rubber, and has a good sliding property with respect to another object as well as good wear resistance and a good gas barrier property. The object having the above portion is a machine part such as an automobile hose, or a pipe other than the automobile hose.

Further, another objective of the invention is to provide an object having a portion to be in contact with another object as well as a method of manufacturing the same. The portion is entirely or partially made of polymer material, such as resin or rubber, and has a good sliding property with respect to another object as well as good wear resistance and water repellency. The object having the above portion is a bicycle part, a sheet, a sport article or its part.

A further objective of the invention is to provide an object having a portion to be in contact with another object as well as a method of manufacturing the same. The portion is entirely or partially made of polymer material, such as resin and rubber, and has a good sliding property with respect to another object as well as good wear resistance, water repellency and a gas barrier property. The object having the above portion is a machine part such as an automobile tire or a bicycle tire.

A further objective of the invention is to provide an object having a portion to be in contact with another object as well as a method of manufacturing the same. The portion is entirely or partially made of at least one kind of material selected from a group including polymer material such as resin and rubber as well as glass, and has a good wear resistance and a good water repellency. The object having the above portion is a machine part such as a diaphragm for an automobile, a window pane for an automobile, an automobile body or its part. The object may be a rain article and its part, a diaphragm for artificial heart diaphragm pump or another diaphragm other than diaphragm of or an automobile.

Particularly, an objective of the invention is to provide a method for manufacturing an object having a deposition surface on which a carbon film is deposited with a good adhesion.

The invention provides an object having a portion to be in contact with another object, the portion being made of at least one kind of material selected from a group including polymer material (typically organic polymer material) such as resin or rubber as well as glass, the portion having a surface entirely or partially coated with a carbon film having wear resistance as well as at least one of lubricity such as a sliding property, water repellency and a gas barrier property.

Further, the invention provides a method of manufacturing an object having a portion to be in contact with another object, the portion being made of at least one kind of material selected from a group including polymer material (typically organic polymer material) such as resin or rubber as well as glass, the portion having a deposition surface entirely or partially coated with a carbon film having wear resistance as well as at least one of lubricity such as a sliding property, water repellency and a gas barrier property, the method including a step of forming the carbon film on the deposition surface of the portion.

Further, the invention provides a method of manufacturing an object having a portion to be in contact with another object, the portion being made of at least one kind of material selected from a group including polymer material (typically organic polymer material), such as resin or rubber, as well as glass, the portion having a deposition surface entirely or partially coated with a carbon film having wear resistance as well as at least one of lubricity such as a sliding property, water repellency and a gas barrier property, the method including a step of forming the carbon film on the deposition surface of the portion after effecting a pretreatment on the deposition surface of the portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
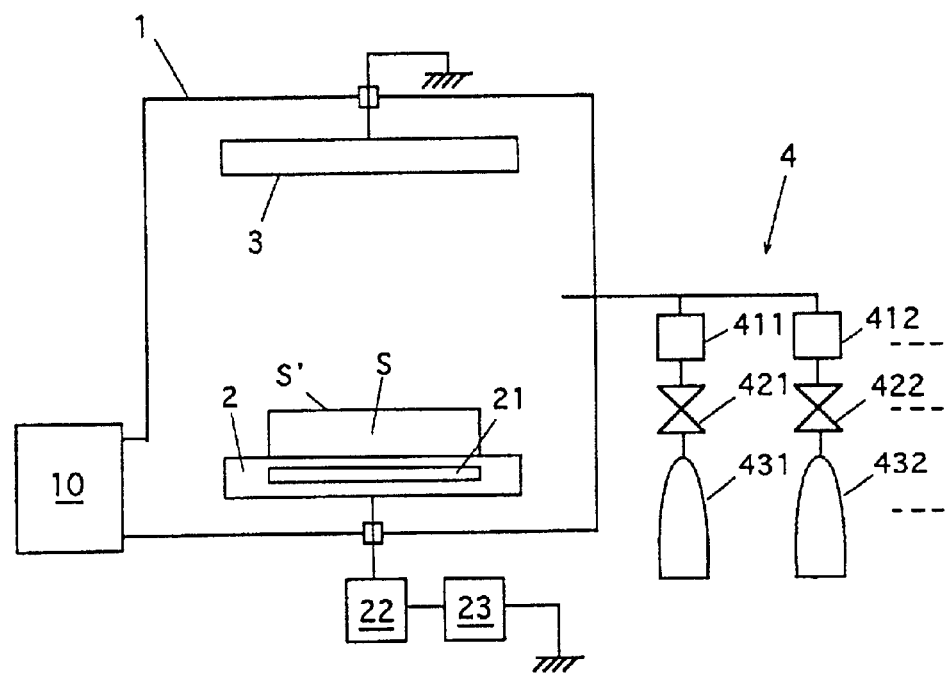
FIG. 1 shows a basic structure of an example of a plasma CVD apparatus for depositing a carbon film.

As already described, the invention provides an object having a portion to be in contact with another object (another good, part, fluid, ground, human body or the like). The portion is made of at least one kind of material selected from a group including polymer material (typically organic polymer material), such as resin or rubber, as well as glass. The portion has a surface entirely or partially coated with a carbon film having wear resistance as well as at least one of a lubricity, such as a sliding property, a water repellency and a gas barrier property. Practical examples of the objects coated with the carbon films are as follows. In the following description of the objects as well as description of methods of forming the objects, the polymer material is typically organic polymer material.

(a) The object is a machine part having a portion to be in contact with another object. The portion is made of polymer material, and the carbon film has a wear resistance and a lubricity.

This machine part may be an automobile part, a bicycle part, a part of an image forming apparatus (a copying machine, a printer, facsimile or the like), a sewing machine part or the like, and is more specifically as follows.

The automobile part may be a vibration damper made of organic polymer material, such as resin or rubber, and used in a drive system, a steering system, an exhaust system, a body part connection, a suspension system or an engine. The automobile part may also be a valve part or a sealing member (a seal member employed at a pipe connection, a seal member for a piston ring or a packing).

A bicycle part may be a bearing or a wire cover of a speed changer made of resin.

The image forming apparatus part may be a resin frame, a record member tray, a gear, a bearing, a record member guide or the like. The part may also be a roller having a surface portion made of rubber, and more specifically may be one of a developing roller in a developing device, fixing and pressure rollers in a fixing device for fixing a toner image on a record member under heat and pressure, an application roller for applying a release agent to the fixing roller, a transfer roller for transferring a toner image produced by developing a latent image on an electrostatic latent image carrier onto a paper sheet, and a cleaning roller for removing toner remaining on the electrostatic latent image The part may also be another rotary member such as another roller or a transfer belt for the image forming apparatus.

The part for the sewing machine may be a resin gear or a resin thread guide.

A machine part other than the above may be a gear, a roller, a guide member, a bearing, a seal member or the like, which are not specified before and are made of an organic polymer material.

The other object, with which the automobile valve part of the embodiment is in contact and will be referred to also as a "contact object", is a valve seat, if the part is the valve member. If the part is a valve seat, the contact object is the valve body. In these cases, the contact surface is defined between the valve body and the valve seat.

(b) The object may be a structure component member having a portion to be in contact with another object (i.e., contact object). The portion is made of polymer material, and is coated with the carbon film having wear resistance and lubricity.

The structure component member may be a wall member, a floor member, a temporary structure member such as a wall having a surface made of organic polymer material such as resin, and also may be a slide door rail member or a slide guide member for a furniture made of resin.

(c) The object may be a toy or its part having a portion to be in contact with another object (i.e., contact object). The portion is made of polymer material, and is coated with the carbon film having wear resistance and lubricity.

The toy and its part may be unit parts for assembling and disassembling, a gear or roller made of resin, a sliding part made of resin or rubber, or the like.

(d) The object may be a machine part having a portion to be in contact with another object (i.e., contact object). The portion is made of polymer material, and is coated with the carbon film having wear resistance, lubricity and a good gas barrier property.

The machine part may be an automobile hose entirely or partially made of polymer material, such as resin or rubber, and is used in a fuel system, an air system, an oil system, an air-conditioning system, a brake system or a cooling water system.

(e) The object may be a pipe having a portion to be in contact with another object (i.e., contact object). The portion is made of polymer material, and is coated with the carbon film having wear resistance, lubricity and a good gas barrier property.

The pipe may be a water pipe, a drainage pipe, a pipe for electric wiring or other hose (other than the automobile hose) entirely or partially made of polymer material such as resin or rubber.

(f) The object may be a bicycle part having a portion to be in contact with another object (i.e., contact object). The portion is made of polymer material, and is coated with the carbon film having wear resistance, lubricity and water repellency.

The bicycle part may be a tire, a rim, a wheel disk used as a substitute for spokes, or the like, which is entirely or partially made of polymer material, such as resin or rubber.

(g) The object may be a sheet having a portion to be in contact with another object (i.e., contact object). The portion is made of polymer material, and is coated with the carbon film having wear resistance, lubricity and water repellency.

The sheet has a surface to be in contact with another object (i.e., contact object). The surface is made of polymer material such as resin. More specifically, the sheet is used as a base sheet for goods, a top sheet over a desk or furniture, a sheet for a tent, an outer wall protective sheet a sheet for a seat in outdoor activity, or the like.

(h) The object may be a sport article or its part having a portion to be in contact with another object (i.e., contact object). The portion is made of polymer material, and is coated with carbon film having wear resistance, lubricity and a water repellency.

The sport article and its part are entirely or partially made of polymer material such as resin or rubber, and may be a ball, a racket frame, a gut, a golf club, a bat, a seal member used as a sport article in a camp tent or the like, a sport shoe such as a ski shoe, an ice skate shoe, a short shoe and boot such as a boot for river fishing.

(i) The object may be an automobile tire or a bicycle having a portion to be in contact with another object (i.e., contact object). The portion is made of polymer material, and is coated with the carbon film having wear resistance, lubricity, water repellency and a gas barrier property.

(j) The object may be a machine part in which the foregoing carbon film has wear resistance and water repellency.

The machine part may be an automobile part (a diaphragm in a diaphragm pump, a window pane, a body or its part) or a bicycle part (fender or the like).

(k) The object may be a rain article or its part having a portion to be in contact with another object (i.e., contact object). The carbon film has wear resistance and water repellency.

The rain article and its part may be a rain shoe, an umbrella, a raincoat or the like entirely or partially made of polymer material, such as rubber or resin.

(l) The object may be a diaphragm for a diaphragm pump having a portion to be in contact with another object (i.e., contact object). The carbon film has wear resistance and water repellency.

The diaphragm may be a diaphragm (except for an automobile part) made of polymer material and used in a diaphragm pump employed, e.g., in an artificial heart or various kinds of fluid circuits.

In the machine part (automobile part, image forming apparatus part or the like), structure component part, toy, or toy part having the portion, which is to be in contact with contact objects, is made of polymer material and is provided with the carbon film having wear resistance and lubricity, the portion provided with the carbon film can achieve a good sliding property with respect to the contact objects, and it is possible to suppress wear and deterioration due to friction between the portion and the contact object. Further, a good sliding property can be maintained for a long term because the carbon film has a high resistance against wear. The carbon film has a certain heat resistance, and its characteristics do not change at a temperature in the image forming apparatus (e.g., about 200° C. at the fixing roller).

When the object having the portion, which is to be in contact with the contact object, is made of polymer material and is provided with a carbon film having wear resistance, lubricity and a good gas barrier property, and particularly in the machine part such as an automobile hose, a water pipe, a drainage pipe, a pipe for electric wiring, a hose (other than automobile hose) or the like, the portion provided with the carbon film can achieve a good sliding property with respect to the contact object such as a good, part or fluid, and is suppressed from wear and deterioration due to friction with the contact object. Further, a good sliding property can be maintained for a long term because the carbon film has a high resistance against wear. The carbon film has a gas barrier property, so that the automobile hose and the pipe can suppress transmission of a gas into and from the interior of the hose and the pipe through the portion provided with the carbon film.

When the object having the portion, which is to be in contact with the contact object, is made of polymer material and is provided with carbon film having wear resistance, lubricity and a water repellency, and particularly in the machine part such as a bicycle part (rim or wheel disk), a sheet, a sport article or its part, the portion provided with the carbon film can achieve a good sliding property with respect to the contact object such as a good, part or ground, and is suppressed from wear and deterioration due to friction with the contact object. Further, a good lubricity can be maintained for a long term because the carbon film has a high resistance against wear. Since the carbon film has a water repellency, adhesion of raindrops and smear onto the portion can be suppressed in the rain.

When the object having the portion, which is to be in contact with the contact object, is made of polymer material and is provided with carbon film having wear resistance, lubricity, water repellency and a gas barrier property, and particularly in the automobile tire or the bicycle tire, the portion provided with the carbon film can achieve a good sliding property with respect to the contact object, and is suppressed from wear and deterioration due to friction with the contact object. Further, a good lubricity can be maintained for a long term because the carbon film has a high resistance against wear. If the carbon film is formed at A portion of the tire which is in contact with a metal wheel fitted into the tire, it is possible to suppress wear and deterioration due to friction with the wheel. If the carbon film is formed at an outer surface other than a surface in contact with a road surface, it is possible to suppress deterioration by external light and exhaust gas to which the surface is exposed. Since the carbon film has a gas barrier property, the carbon film formed at an inner surface of the tire can suppress transmission of water vapor into the tire. Therefore, if a tube is arranged inside the tire, deterioration of the tube by water vapor can be suppressed. Since the carbon film has water repellency, the carbon film formed at the inner surface of the tire groove can suppress remaining of water and mud in the groove in the rain.

When the object in which the carbon film has wear resistance and water repellency, and particularly in the machine part (a diaphragm in a diaphragm pump, a window pane, a body or its part for an automobile), or a diaphragm (except for an automobile part) made of organic polymer material and used in a diaphragm pump employed in an artificial heart or various kinds of fluid circuits, the portion provided with the carbon film is suppressed from wear and deterioration due to friction with the contact object (diaphragm fastener or the like), and is also suppressed from adhesion of liquid or the like. In the wind screen or other pane of the a automobile, the portion provided with the carbon film can be suppressed from being scratched due to contact with the contact object (e.g., sand particles), and can be suppressed from adhesion of raindrops in the rain. In the automobile body or its part, the portion provided with the carbon film can be suppressed from being scratched at a decorating paint coating due to contact with the contact object, and can be suppressed from adhesion of raindrops in the rain. Also, dust or the like adhered onto the portion can be removed easily.

When the rain article or its part having the portion, which is to be in contact with the contact object, is made of polymer material, and is provided with carbon film having wear resistance and water repellency, the portion provided with the carbon film can be suppressed from being damaged due to contact with the contact object, and can be suppressed from adhesion of raindrops or mud.

The rubber may be natural rubber, butyl rubber, ethylene-propylene rubber, chloroprene rubber, chlorinated polyethylene rubber, epichlorohydrin rubber, acrylic rubber, nitrile rubber, urethane rubber, silicone rubber, fluororubber or the like.

The resin may be thermosetting resin or thermoplastic resin.

The thermosetting resin may be phenol-formaldehyde resin, urea resin, melamine-formaldehyde resin, epoxy resin, furan resin, xylene resin, unsaturated polyester resin, silicone resin, diallyl phthalate resin or the like.

The thermoplastic resin may be vinyl resin (polyvinyl chloride, polyvinyl dichloride, polyvinyl butyrate, polyvinyl alcohol, polyvinyl acetate, polyvinyl formal or the like), polyvinylidene chloride, chlorinated polyether, polyester resin (polystyrene, styrene.acrylonitrile copolymer or the like), ABS, polyethylene, polypropylene, polyacetal, acrylic resin (poly methyl methacrylate, denatured acrylic or the like), polyamide resin (nylon 6, 66, 610, 11 or the like), cellulosic resin (ethyl cellulose, acetyl cellulose, propyl cellulose, cellulose acetate butyrate, cellulose nitrate or the like), polycarbonate, phenoxy resin, fluorocarbon resin (trifluoro chloro ethane, ethylene tetrafluoride, ethylene tetrafluoride.propylene hexafluoride, vinylidene fluoride or the like), or polyurethane or the like.

If a larger strength and a larger hardness are required, for example, in the case where the object is an automobile vibration damper or the like for bearing a heavy member, the object or its surface may be made of resin having larger strength and hardness than rubber.

If the object is a pipe or a hose for an automobile or the like for flowing a reactive gas such as an exhaust gas of an automobile, the object or its gas contact surface portion may be made of resin having a higher chemical stability than rubber and therefore a high resistance against deterioration.

If the object is a diaphragm, e.g., for an automobile or a seal member, e.g., for an automobile, the same is true with respect to this case. If the object is to be in contact with a highly reactive gas or liquid, the object or its gas/liquid contact surface portion may be made of resin having a higher chemical stability than rubber and therefore a high resistance against deterioration. The resin for the automobile seal member or its surface portion may be, for example, polyamide resin or polytetrafluorethylene resin.

The automobile valve part may have a surface, which is coated with the carbon film and is made of organic polymer material such as a polyimide resin or polytetrafluorethylene resin having a relatively high heat resistance.

The automobile body and its part according to the invention may have such a structure that at least a carbon film deposition surface is made of polymer material such as resin. In general, the automobile body is made of metal and is provided at its outer surface with a paint film made of resin or the like. The body may be entirely made of resin.

In any case, the carbon films in the foregoing objects as well as carbon films which will be described later in connection with an object manufacturing method are typically DLC (Diamond Like Carbon) films. The DLC film has a good lubricity, and has a sufficient resistance against wear which may be caused by friction with another object. Also, the DLC film can have an appropriate hardness so that the thickness thereof can be adjusted to keep flexibility of the base body which originally has the flexibility. It also has a good gas barrier property, good water repellency and a good electric insulating property. By adjusting the thickness thereof, it allows transmission of light, so that the DLC film can be suitably employed at a surface of an automobile window pane. Further, it can be formed at a relatively low temperature, which allows easy deposition.

In any case, the thickness of the carbon film can be in a range which allows deposition on an object with good adhesion, allows a sufficient function as a protective film for an object and can keep the original flexibility of the object.

As already described, the invention provides a method of manufacturing an object having a portion to be in contact with another object. The portion is made of at least one kind of material selected from a group including polymer material such as resin or rubber as well as glass. The portion has a surface entirely or partially coated with a carbon film having wear resistance as well as at least one of lubricity, water repellency and a gas barrier property. The method includes a step of forming the carbon film on a deposition surface of the portion. The carbon film is desirably formed by a plasma CVD method, an ion-plating method or a sputtering method because these methods can form the film without thermally damaging the deposition surface of the object. In particular, if the deposition surface is made of material such as resin or rubber having a low heat resistance, these deposition methods are further desired. Among these methods, the plasma CVD method can smoothly form a carbon film such as a diamond like carbon film.

As already described, the invention provides a method of manufacturing an object having a portion to be in contact with another object, the portion being made of at least one kind of material selected from a group including polymer material such as resin or rubber as well as glass, the portion having a surface entirely or partially coated with a carbon film having a wear resistance as well as at least one of lubricity, water repellency and a gas barrier property, the method including a step of forming the carbon film on a deposition surface of the portion after effecting a pretreatment on the deposition surface of the portion. The pretreatment may be performed by exposing the deposition surface to a plasma of at least one kind of pretreatment gas selected from a group including a fluorine (F)-containing gas, an hydrogen ($H_2$) gas and an oxygen ($O_2$) gas.

The above fluorine-contained gas may be fluorine ($F_2$) gas, nitrogen trifluoride ($NF_3$) gas, sulfur hexafluoride ($SF_6$) gas, carbon tetrafluoride ($CF_4$) gas, silicon tetrafluoride ($SiF_4$) gas, disilicon hexafluoride ($Si_2F_6$) gas, chlorine trifluoride ($ClF_3$) gas, hydrogen fluoride (HF) gas or the like.

By exposing the deposition surface to the plasma of the above pretreatment gas, the surface of the object is cleaned, and the roughness of the object surface is improved. These contribute to improvement of the carbon film adhesion, and, therefore, allows deposition of the carbon film with a high adhesion.

When employing the plasma of a fluorine-containing gas, fluorine termination is formed at the object surface. When employing plasma of hydrogen gas, hydrogen termination is formed at the object surface. Since fluorinecarbon coupling and hydrogen-carbon coupling are stable, the above termination treatment can provide stable coupling of carbon atoms it the film with fluorine atoms or hydrogen atoms in the deposition surface portion. Owing to this fact, it is possible to improve the adhesion between the object and the carbon film to be deposited subsequently.

When employing an oxygen gas plasma, contaminants such as organic matter sticking to the deposition surface can be particularly efficiently removed, which can improve the adhesion between the object and the carbon film to be deposited later.

The pretreatment of the deposition surface by the plasma prior to the carbon film deposition may be performed several times with the same kind of plasma or different kinds of plasma. For example, if the deposition surface is made of polymer material, such as rubber or resin, or is made of glass, it may be exposed to a fluorine-containing gas plasma or hydrogen-containing gas plasma after exposing the deposition surface to an oxygen gas plasma. When the carbon film is subsequently deposited thereon, fluorine or hydrogen termination is formed at the surface after the surface is cleaned, so that the carbon film deposited thereafter has a very good adhesion to the object.

Even in the case where the pretreatment is performed, the plasma CVD method, ion-plating method or sputtering method is desirably employed for carbon film deposition, because these methods allow deposition without thermally damaging the deposition surface. Particularly, these methods are desired when the deposition surface is made of material such as resin or rubber having an insufficient heat resistance. Among these methods, the plasma CVD is most advantageous because the pretreatment and the carbon film deposition can be performed by the same apparatus.

Further, when the portion of the object to be in contact with another object is made of polymer material, the pretreatment on the deposition surface of the portion may be performed by irradiating ultraviolet rays and/or electron rays on the deposition surface of the portion for producing uncombined carbon atoms.

This carbon film forming method can be widely used for formation of the carbon film on an object made of polymer material, such as resin or rubber.

More broadly, therefore, the invention provides a method of forming a carbon film on an object made of polymer material such as rubber or resin. In this method, uncombined carbon atoms are produced at the deposition surface of the object made of polymer material, such as rubber or resin, by irradiating ultraviolet rays and/or electron rays, and then a carbon film (typically, a diamond like carbon film) is formed on the deposition surface.

The uncombined carbon atoms improve the adhesion between the deposition surface and the carbon film deposited after the pretreatment.

After producing the uncombined carbon atoms on the deposition surface by irradiating ultraviolet rays and/or electron rays to the deposition surface, the surface may be exposed to a plasma of at least one kind of gas selected from a fluorine-containing gas and hydrogen gas. Thereby, the uncombined carbon atoms are covered with fluorine and/or hydrogen, so that adhesion of impurities is prevented, and, therefore, the adhesion between the deposition surface and the carbon film deposited after the pretreatment is further improved.

The fluorine-containing gas may be the same as that already described.

Even when the pretreatment is performed, the plasma CVD method, ion-plating method or sputtering method may be employed for formation of the carbon film after the pretreatment, and the plasma CVD method is the most desirable. The plasma CVD method is recommended for deposition of the diamond like carbon film. In any case, the polymer material to be coated with the deposited film may be cooled to suppress temperature rising during deposition of the carbon film.

For deposition of the carbon film by the foregoing plasma CVD method (and the plasma CVD method to be described later), the deposition material gas may be a carbon compound gas such as methane ($CH_4$), ethane ($C_2H_6$) propane ($C_3H_8$), butane ($C_4H_{10}$), acetylene ($C_2H_2$), benzene ($C_6H_6$), carbon tetrafluoride ($CF_4$) and carbon hexafluoride ($C_2F_6$). If necessary, the material gas may be a mixture of the above carbon compound gas and a carrier gas such as a hydrogen gas, or an inert gas (Ar, Ne, Xe, He or the like).

In any of the foregoing carbon film deposition methods, the plasma CVD method for depositing the carbon film may use a deposition material gas formed of a gas of a carbon compound for forming the carbon film, or a gas of a carbon compound and another kind of gas different from the carbon compound gas for forming the carbon film. A plasma may be formed from the deposition material gas by application of radio-frequency (RF) electric power and DC power. In this method, the DC power is applied to an electrode carrying the deposition target object, so that the carbon film is deposited on the deposition surface of the deposition target object under the plasma thus produced.

According to the plasma CVD method, the plasma is formed from the deposition material gas while applying the DC power to the electrode carrying the deposition target object, so that ionized particles in the plasma are accelerated toward the deposition target object, and the accelerated particles produces a cleaning effect to remove contaminants or the like sticking to the surface of the object while the deposition is being performed. In addition to this cleaning effect, ionized particles contributing to the deposition are implanted into a surface portion of the object to form a inclination composition layer, so that a film having a good adherence to the object can be formed.

The other electrode opposed to the electrode carrying the deposition target object may be disposed in a container for deposition, and therefore may be an electrode opposed to the electrode serving as the object holder in the parallel-plated plasma CVD apparatus. Alternatively, the other electrode may be an induction coil electrode wound around the container for deposition in the induction coupling type plasma CVD apparatus.

Said RF power may be a modulated RF power. The modulation may be pulse modulation performed by on/off of power application or pulse-like modulation, and may be broadly an amplitude modulation.

A plasma of a high density can be produced owing to this modulation, which is effected on the RF power for plasma production from the deposition material gas, so that a reactivity is improved, and therefore deposition at a low temperature is allowed. Owing to the above modulation, the temperature of electrons and ions in the plasma is controlled to increase relatively the amount of produced radicals in the plasma which contribute to the deposition. This promotes reaction at the surface of the deposition target object, and therefore improves the film adherence and deposition rate.

A basic RF power before modulation may have, for example, a sinusoidal, square, saw-tooth-like or triangular waveform.

The basic RF power before modulation may have a predetermined frequency (e.g., 13.56 MHz) between about 10 MHz and about 100 MHz, and a pulse modulation is effected on the basic RF power with a modulation frequency between about $1/10^5$ and about 1/10 of the predetermined frequency, and more preferably between about $1/10^4$ and about $1/10^3$. In other words, the pulse-modulated RF power may be produced by effecting the pulse modulation on the basic RF power having a frequency in the above range with the modulation frequency between about 100 Hz and about 10 MHz, and more preferably between about 1 kHz and about 100 kHz.

Especially for deposition of a carbon (C) film, the pulse modulation may be effected on the basic RF power of a frequency of, e.g., 13.56 MHz, with the modulation frequency from about 100 Hz to about 500 kHz. In particular, for forming a highly crosslinked carbon film, the modulation frequency from about 100 Hz to about 5 kHz is desirably employed. For depositing a high-density carbon film, the modulation frequency from about 10 kHz to about 100 kHz is desirably employed.

The reason for employing the basic RF power of a frequency in the above range is as follows. If it were lower than 10 MHz, the plasma density would be insufficient. Even if it were higher than 100 MHz, the plasma density would not be improved further, and an electric power cost would uselessly increase. The reason for employing the pulse modulation frequency in the above range is as follows. If it were lower than 100 Hz, the modulation would not provide an effect of improving the plasma density. Even if it were higher than 10 MHz, the plasma density would not be improved further, and an electric power cost would uselessly increase.

The duty ratio (on-time/(on-time+off-time)) of the pulse modulation may be from about 10% to about 90%. Although not restricted, it may be typically about 50%. If it were lower than 10%, the reaction time would be short and therefore the deposition rate would lower. If it were higher than 90%, a time for power application would be excessively long, and therefore an effect of improving the plasma density by the modulated RF power would be reduced.

The DC potential applied to the electrode carrying the deposition target object is usually negative potential. The negative potential during deposition has a magnitude, which does not cause or substantially cause etching of the deposition target object and/or the film formed thereon by ionized particles which are accelerated.

The RF power may be applied to the electrode carrying the deposition target object, in which case an RF power and a DC power are applied together in a superposed manner. Alternatively, the RF power may be applied to the electrode opposed to the electrode carrying deposition target object.

In the case where the RF power is applied to the electrode carrying the deposition target object, ionized particles exert a large impact to the deposition target object. Therefore, the electrode supplied with the RF power may be selected depending on material, purpose and others of the deposition target object. The DC power may be in a pulse form, which further improves a density of the plasma produced by electric discharging. Also, the effect of accelerating the ionized particles in the plasma toward the deposition target object may be the same or improved, because the ionized particles are particularly strongly accelerated during turn-on of the DC power.

The frequency of the pulse may be in a range from about 1 kHz to about 100 kHz, because the frequency lower than 1 kHz would not improve the effect of improving the plasma density, and the frequency higher than 100 kHz would uselessly increase the cost without further improving the effect of improving the plasma density. The duty ratio may be in a range from about 10% to about 90%, and is typically about 50%, although not restricted thereto.

In the plasma CVD method for depositing the carbon film, a carbon interface layer may be formed on the deposition surface of the deposition target object, and subsequently an upper carbon layer film may be deposited on the interface layer. For deposition of the carbon interface layer, the deposition material gas may be formed of a gas of a carbon compound for forming the carbon interface layer, or a gas of a carbon compound and another kind of gas different from the carbon compound gas for forming the carbon interface layer, and the plasma may be formed from the deposition material gas by application of a radio-frequency (RF) electric power and a DC electric power. The DC power may be applied to an electrode carrying the deposition target object, so that the carbon interface layer may be deposited on the deposition surface of the deposition target object under the plasma thus produced.

In this case, the interface layer thus formed can have a good adherence to the deposition target object.

The power applied for formation of the upper layer is not restricted, and the interface and upper layers are made of the same material and thus have good adjustment properties, so that a good adherence can be achieved between them. In addition to the interface layer, the upper layer may also be formed in the same manner as that of the interface layer, in which case the adherence between them can be further improved.

Such a method may be employed that, either or both of a nitrogen ($N_2$) gas and an ammonia ($NH_3$) gas may be supplied together with or instead of the deposition material gas for carbon film deposition before completion of the deposition of the carbon film while continuing application of the electric power, so that a carbon nitride layer may be formed at the surface portion of the carbon film.

In the case where a different kind of gas such as hydrogen gas is used as the deposition material gas for carbon film deposition, the gas containing nitrogen (N) may be supplied instead of the deposition material gas, in which case only supply of the carbon compound gas may be stopped, and the different kind of gas may be continuously supplied, which is allowed depending on the kind of gas.

Since carbon nitride has an extremely high hardness, the deposited carbon film can have an improved hardness. Since both the nitride layer and the carbon film under the same contains carbon, they have good adjustment properties and therefore a good adherence.

Specific Embodiments will now be described below.

FIGS. 1 through 9 schematically show basic structures of examples of plasma CVD apparatuses for forming carbon films on deposition target objects.

The apparatus shown in FIG. 1 is a parallel-plated plasma CVD apparatus, and has a vacuum chamber 1 provided with an exhaust device 10 including a pressure regulating valve and an exhaust pump. In the chamber 1, electrodes 2 and opposed to each other are arranged. The electrode 3 is grounded. The electrode 2 is connected to an RF power source 23 via a matching box 22. A temperature controller 21 is arranged at the electrode 2. The temperature controller 21 includes a heater and a cooling device for controlling, if necessary, the deposition temperature of the deposition target object carried on the electrode. A gas supply unit 4 is connected to the chamber 1 for supplying a plasma material gas into the chamber 1. The gas supply unit 4 includes one or more gas sources 431, 432, . . . of material gases connected to mass flow controllers 411, 412, . . . and valves 421, 422 . . . .

For forming the carbon film on the deposition target object by the above apparatus, the deposition target object S is arranged on the electrode 2 with its object contact surface (i.e., deposition surface) S' directed toward the electrode 3, and the exhaust device 10 operates to attain a predetermined degree of vacuum in the chamber 1. The gas supply unit 4 supplies at least one kind of pretreatment gas selected from a fluorine-contained gas, a hydrogen gas and an oxygen gas into the chamber 1. Also, the RF power source 23 supplies an RF power to the electrode 2 through the matching box 22, so that a plasma is formed from the pretreatment gas, and the surface treatment is effected on the deposition target object s in the plasma thus produced. This surface treatment (pretreatment) is desired but is not essential.

After the pretreatment, if necessary, the chamber 1 is exhausted again to attain a predetermined degree of vacuum. Then, the gas supply unit 4 supplies a deposition material gas, i.e., a carbon compound gas into the chamber 1, and the RF power source 23 supplies an RF power to the electrode 2. Thereby, a plasma is formed from the carbon compound gas thus supplied, and a carbon film is deposited on the contact surface S' of the object S, which is to be in contact with another object (i.e., contact object), in the plasma.

If the deposition target object has, for example, a circular section, the deposition surface which is an outer peripheral surface has a three-dimensional configuration. In this case, rotary means (not shown) is employed to rotate appropriately the object S for effecting the surface treatment and deposition entirely and uniformly on the deposition surface.

Regardless of the configuration of the deposition surface, a portion, over which the carbon film is not to be deposited, is masked by a film or the like.

Figure 2:
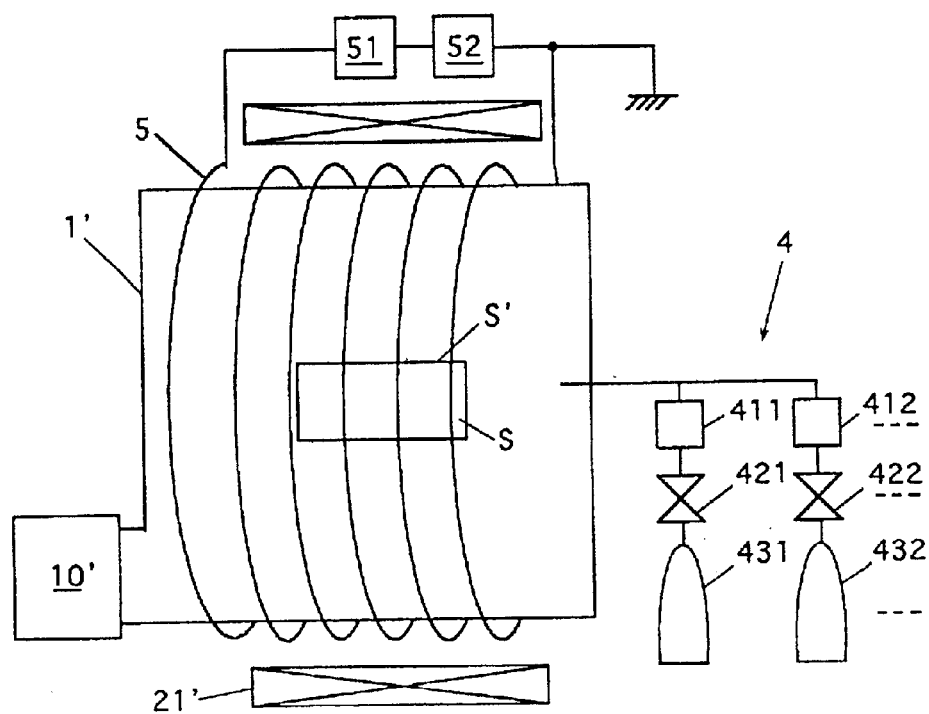
FIG. 2 shows a basic structure of another example of a plasma CVD apparatus for depositing a carbon film.

A plasma CVD apparatus shown in FIG. 2 is of an induction coupling type. This apparatus can efficiently deposit a film even if the deposition target object has a three-dimensional configuration.

The apparatus in FIG. 2 has a vacuum container 1', around which an induction coil electrode 5 is wound. Opposite ends of the electrode 5 are connected to a matching box 51 and an RF power source 52. A temperature controller 21' is arranged at the outside of the vacuum container 1'. The temperature controller 21' includes a heater and a cooling device for controlling, if necessary, the deposition temperature of the deposition target object.

The vacuum container 1' is connected to an exhaust device 10' including a pressure regulating valve and an exhaust pump via a piping to the vacuum container 1', and is also connected to the gas supply unit 4 of the deposition material gas which is similar to that in the apparatus shown in FIG. 1.

For forming the carbon film on the deposition target object S by the above apparatus, the deposition target object S is arranged in the vacuum container 1', and the exhaust device 10', operates to attain a predetermined degree of vacuum in the chamber 1'. The gas supply unit 4 supplies at least one kind of pretreatment gas selected from a fluorine-contained gas, a hydrogen gas and an oxygen gas into the chamber 1'. Also, the RF power source 52 supplies an RF power to the induction coil electrode 5 through the matching box 51, so that a plasma is formed from the pretreatment gas, and the surface treatment is effected on the deposition target object S in the plasma thus produced. This surface treatment (pretreatment) is desired but is not essential.

If necessary, the chamber 1' is exhausted again to attain a predetermined degree of vacuum. Then, the gas supply unit 4 supplies a deposition material gas, i.e., a carbon compound gas into the chamber 1', and the RF power source 52 supplies an RF power to the electrode 5. Thereby, a plasma is formed from the carbon compound gas thus supplied, and a carbon film is deposited on the contact surface S' of the object S in the plasma.

If the deposition target object has, for example, a section, the deposition surface which is an outer peripheral surface has a three-dimensional configuration. In this case, if necessary, rotary means (not shown) is employed to rotate appropriately the object S. A portion, over which the carbon film is not to be deposited, is masked by a film or the like.

According to the plasma CVD methods and apparatuses, the deposition surface made of organic polymer material or glass is exposed to at least one pretreatment gas selected from a fluorine-contained gas, a hydrogen gas and an oxygen gas before deposition. Thereby, the surface of the object S is cleaned and the surface roughness of the object S is improved. When employing the plasma of the fluorine-contained gas and/or the hydrogen gas, fluorine termination and/or hydrogen termination are formed at the object surface. When the oxygen gas plasma is employed, contaminants such as organic matters adhered to the surface of the object S can be removed particularly efficiently, so that the adhesion between the object S and the carbon film to be deposited subsequently is further improved.

Experimental examples which were performed with the apparatus shown in FIG. 1 will now be described below. In these examples, DLC (diamond like carbon) films were formed on surfaces of test pieces made of three-dimensional copolymer rubber of ethylene-propylene-diene monomer (EPDM), which is often used as material of various kinds of machine parts such as a vibration damper, a hose, a tire, a diaphragm and a seal member for an automobile, an image forming apparatus part (e.g., a roller) and an bicycle part as well as a sport article and its part, a rain article and its part, and a diaphragm of a diaphragm pump other than the diaphragm for an automobile.

EXPERIMENTAL EXAMPLE 1-1

A pretreatment with a pretreatment gas plasma was not effected on a test piece, and a DLC film is formed directly on an outer surface of the test piece.

| | |
|---|---|
| Material of test piece: | EPDM |
| Sizes of test piece: | 20 cm × 20 cm × 1 cm (thickness) |
| Size of RF electrode 2: | 40 cm × 40 cm |
| Deposition Conditions | |
| Material gas: | methane ($CH_4$), 100 sccm |
| RF power: | 13.56 MHz, 300 W |
| Degree of vacuum: | 0.1 Torr |
| Deposition rate: | 500 Å/min. |
| Deposition time: | 20 min. |

EXPERIMENTAL EXAMPLE 1-2

A pretreatment with a hydrogen gas plasma was effected under the following conditions on the same test piece as that in the experimental example 1-1 prior to deposition. The deposition conditions were the same as those in the experimental example 1-1.

| Pretreatment Conditions | |
|---|---|
| Pretreatment gas: | hydrogen ($H_2$), 100 sccm |
| RF power: | 13.56 MHz, 300 W |
| Degree of vacuum: | 0.1 Torr |
| Pretreatment time: | 5 minutes |

EXPERIMENTAL EXAMPLE 1-3

A pretreatment with a fluorine compound gas plasma was effected under the following conditions on the same test piece as that in the experimental example 1-1 prior to deposition. The deposition conditions were the same as those in the experimental example 1-1.

| Pretreatment Conditions | |
|---|---|
| Pretreatment gas: | sulfur hexafluoride ($SF_6$), 100 sccm |
| RF power: | 13.56 MHz, 300 W |
| Degree of vacuum: | 0.1 Torr |
| Pretreatment time: | 5 minutes |

EXPERIMENTAL EXAMPLE 1-4

Under the following conditions, a first pretreatment with an oxygen gas plasma was effected on the same test piece as that in the experimental example 1-1, and then a second pretreatment was effected with a hydrogen gas plasma prior to deposition. The deposition conditions were the same as those in the experimental example 1-1.

| First Pretreatment Conditions | |
|---|---|
| Pretreatment gas: | oxygen ($O_2$), 100 sccm |
| RF power: | 13.56 MHz, 300 W |
| Degree of vacuum: | 0.1 Torr |
| Pretreatment time: | 5 minutes |

| Second Pretreatment Conditions | |
|---|---|
| Pretreatment gas: | hydrogen (H$_2$), 100 sccm |
| RF power: | 13.56 MHz, 300 W |
| Degree of vacuum: | 0.1 Torr |
| Pretreatment time: | 5 minutes |

EXPERIMENTAL EXAMPLE 1-5

Under the following conditions, a first pretreatment with an oxygen gas plasma was effected on the same test piece as that in the experimental example 1-1, and then a second pretreatment was effected with a fluorine compound gas plasma prior to deposition. The deposition conditions were the same as those in the experimental example 1-1.

| First Pretreatment Conditions | |
|---|---|
| Pretreatment gas: | oxygen (O$_2$), 100 sccm |
| RF power: | 13.56 MHz, 300 W |
| Degree of vacuum: | 0.1 Torr |
| Pretreatment time: | 5 minutes |
| Second Pretreatment Conditions | |
| Pretreatment gas: | sulfur hexafluoride (SF$_6$), 100 sccm |
| RF power: | 13.56 MHz, 300 W |
| Degree of vacuum: | 0.1 Torr |
| Pretreatment time: | 5 minutes |

Then, description will be given on experimental examples in which the apparatus in FIG. 1 was used, and DLC films were formed on test pieces made of polyimide, i.e., material which may be used as material of automobile valve parts and others.

EXPERIMENTAL EXAMPLE 1-6

A pretreatment with a pretreatment gas plasma was not effected on a test piece, and a DLC film is formed directly on an outer surface of the test piece.

| | |
|---|---|
| Material of test piece: | polyimide |
| Sizes of test piece: | 20 cm × 20 cm × 1 cm (thickness) |
| Size of RF electrode 2: | 40 cm × 40 cm |
| Deposition Conditions | |
| Material gas: | methane (CH$_4$), 100 sccm |
| RF power: | 13.56 MHz, 300 W |
| Degree of vacuum: | 0.1 Torr |
| Deposition rate: | 500 Å/min. |
| Deposition time: | 20 minutes |

EXPERIMENTAL EXAMPLE 1-7

A pretreatment with a hydrogen gas plasma was effected under the following conditions on the same test piece as that in the experimental example 1-6 prior to deposition. The deposition conditions were the same as those in the experimental example 1-6.

| Pretreatment Conditions | |
|---|---|
| Pretreatment gas: | hydrogen (H$_2$), 100 sccm |
| RF power: | 13.56 MHz, 300 W |
| Degree of vacuum: | 0.1 Torr |
| Pretreatment time: | 5 minutes |

EXPERIMENTAL EXAMPLE 1-8

A pretreatment with a fluorine compound gas plasma was effected under the following conditions on the same test piece as that in the experimental example 1-6 prior to deposition. The deposition conditions were the same as those in the experimental example 1-6.

| Pretreatment Conditions | |
|---|---|
| Pretreatment gas: | sulfur hexafluoride (SF$_6$), 100 sccm |
| RF power: | 13.56 MHz, 300 W |
| Degree of vacuum: | 0.1 Torr |
| Pretreatment time: | 5 minutes |

EXPERIMENTAL EXAMPLE 1-9

Under the following conditions, a first pretreatment with an oxygen gas plasma was effected on the same test piece as that in the experimental example 1-6, and then a second pretreatment was effected with a hydrogen gas plasma prior to deposition. The deposition conditions were the same as those in the experimental example 1-6.

| First Pretreatment Conditions | |
|---|---|
| Pretreatment gas: | oxygen (O$_2$), 100 sccm |
| RF power: | 13.56 MHz, 300 W |
| Degree of vacuum: | 0.1 Torr |
| Pretreatment time: | 5 minutes |
| Second Pretreatment Conditions | |
| Pretreatment gas: | hydrogen (H$_2$), 100 sccm |
| RF power: | 13.56 MHz, 300 W |
| Degree of vacuum: | 0.1 Torr |
| Pretreatment time: | 5 minutes |

EXPERIMENTAL EXAMPLE 1-10

Under the following conditions, a first pretreatment with an oxygen gas plasma was effected on the same test piece as that in the experimental example 1-6, and then a second pretreatment was effected with a fluorine compound gas plasma prior to deposition. The deposition conditions were the same as those in the experimental example 1-6.

| First Pretreatment Conditions | |
|---|---|
| Pretreatment gas: | oxygen (O$_2$), 100 sccm |
| RF power: | 13.56 MHz, 300 W |
| Degree of vacuum: | 0.1 Torr |
| Pretreatment time: | 5 minutes |

-continued

| Second Pretreatment Conditions | |
|---|---|
| Pretreatment gas: | sulfur hexafluoride (SF$_6$), 100 sccm |
| RF power: | 13.56 MHz, 300 W |
| Degree of vacuum: | 0.1 Torr |
| Pretreatment time: | 5 minutes |

Evaluation was performed on a friction coefficient with an aluminum member, characteristics of wear by a diamond member and a water repellency of test pieces with DLC films produced in the foregoing experimental examples 1-1 to 1-5 and a similar test piece (comparative experimental example 1-1) not provided with a DLC film as well as test pieces with DLC films produced in the foregoing experimental examples 1-6 to 1-10 and a similar test piece (comparative experimental example 1-2) not provided with a DLC film. Also, evaluation was performed on an adhesion property between the test pieces and the DLC films which were produced in the experimental examples 1-1 to 1-10.

Evaluation was also performed on a comparative experimental example 1-3, in which a similar test piece of EPDM without a pretreatment was coated with a polytetrafluoroethylene film baked thereto. More specifically, this evaluation was performed on a friction coefficient with respect to an aluminum member, characteristics of wear by a diamond member and an adhesion property between the polytetrafluorethylene film and the test piece.

The friction coefficient was measured in such a manner that a tip end of a pin-like object made of aluminum was brought into contact with a surface of a test piece, and the pin was moved at a speed of 20 mm/sec while applying a load of 10 grams to the pin-like object. The wear characteristics were evaluated in such a manner that a tip end of a pin-like object made of diamond, which was brought into contact with a surface of a test piece, was moved at a speed of 20 mm/sec while applying a load of 100 grams to the object, and a depth of worn portion per one hour was measured. The film adhesion property was evaluated by a pulling method. In this method, a columnar member which was joined to a film surface by adhesive was pulled perpendicularly to the film for removing the film from the test piece, and a force required for removal of the film was measured. The water repellency was evaluated by measuring a contact angle between a test piece and a waterdrop located on the test piece.

Generally, the contact angle represents one of angles defined between a surface of a solid and a tangential line extending through a contact point among three phases, i.e., solid, liquid and gas in such a situation that a fluid droplet is located on the solid surface in the air, and more specifically represents the angle containing the liquid droplet. The larger value represents a better water repellency.

The results are substantially shown in the following table. In tables which will be described below and later, "EX" represent an experimental example, and "CE" represents comparative experimental example.

| | F/CF | W/PR ($\mu$m/h) | F/AD (kg/mm$_2$) | C/AG (degree) |
|---|---|---|---|---|
| EX 1-1 | 1 | 0.9 | 2 | 100 |
| EX 1-2 | 1 | 0.7 | 4 | 100 |
| EX 1-3 | 1 | 0.7 | 4 | 100 |
| EX 1-4 | 1 | 0.5 | 5 | 100 |
| EX 1-5 | 1 | 0.5 | 5 | 100 |
| EX 1-6 | 1 | 0.7 | 2 | 110 |
| EX 1-7 | 1 | 0.6 | 4 | 110 |
| EX 1-8 | 1 | 0.6 | 4 | 110 |
| EX 1-9 | 1 | 0.5 | 5 | 110 |
| EX 1-10 | 1 | 0.5 | 5 | 110 |
| CE 1-1 | 3 | 2.5 | — | 80 |
| CE 1-2 | 3 | 1.8 | — | 85 |
| CE 1-3 | 1 | 0.9 | 2 | — |

F/CF: friction coefficient
W/PR: wear property
F/AD: film adhesion strength
C/AG: contact angle As can be seen from the above, all the test pieces coated with the DLC films in the experimental examples 1-1 to 1-5 and those in the experimental examples 1-6 to 1-10 have smaller friction coefficients with respect to the aluminum member than the test pieces in the comparative experimental examples 1-1 and 1-2 not provided with the DLC film, respectively, and therefore have better lubricities (sliding properties). Also, all the test pieces in the experimental examples exhibited better wear properties with respect to the diamond member than those of the comparative experimental examples 1-1 and 1-2 not provided with the DLC film.

The following can be understood with respect to adhesion strengths of the DLC films to the test piece body in the experimental examples 1-1 to 1-10. The test pieces in the experimental examples 1-2 to 1-5, in which pretreatment was effected with the plasma on the surfaces of the test piece bodies prior to deposition of the DLC films, exhibited better strengths than that in the experimental example 1-1 not employing the pretreatment, and the test pieces 1-7 to 1-10 employing the pretreatment exhibited better strengths than that in the experimental example 1-6 not employing the pretreatment.

The test pieces coated with the DLC films in the experimental examples 1-1 to 1-5 and the experimental examples 1-6 to 1-10 exhibited larger water contact angles that those in the comparative experimental examples 1-1 and 1-2, respectively, and therefore have better water repellencies.

Deposition of the DLC films in all the experimental examples could be performed at a low temperature of 120° C. However, formation of the polytetrafluoroethylene film in the experimental example 1-3 required baking at 360° C.

In a manner similar to the experimental example 1-1, such a test piece (experimental example 1-11) was prepared that a DLC film is formed on one of surfaces of a film made of polyvinylidene chloride and containing fatty-acid derivative as a softening agent and epoxidation vegetable oil as a stabilizer. Also, a similar film test piece (comparative experimental example 1-4) neither provided with a DLC film nor pretreated was prepared. Moisture (water vapor) permeabilities and oxygen permeabilities of these test pieces were measured.

The moisture permeabilities were evaluated by measuring a transmission rate of water vapor with a gas transmittance measuring device manufactured by Mocon Corporation under such conditions that the temperature was 25° C., a relative humidity of nearly 100% was kept at one of spaces at opposite sides of the film, and a relative humidity of nearly 0% was kept at the other space. The oxygen permeabilities were likewise evaluated by measuring a transmission rate of oxygen with the gas transmittance measuring device manufactured by Mocon Corporation under such conditions that the temperature was 25° C., an oxygen concentration of nearly 100% was kept at one of spaces at opposite sides of the film, and an oxygen concentration of nearly 0% was kept at the other space. The results are as follows.

|  | Moisture Transmitance (cc/m$^2$/day) | Oxygen Transmitance (cc/m$^2$/day) |
|---|---|---|
| EX 1-11 | 0.9 | 1.2 |
| CE 1-4 | 12.5 | 14.0 |

As can be seen from the above, the test piece in the experimental example 1-11 coated with the DLC film can suppress transmission of both the water vapor and oxygen than the test piece in the comparative experimental example 1-3 not coated with a DLC film. The test piece in the experimental example 1-11 has a good gas barrier property.

Experimental examples 2-1, 2-2 and 2-3 which were performed with the apparatus shown in FIG. 1 will now be described below. In these examples, DLC films were formed on surfaces of three kinds of test pieces, where were made of phenol-formaldehyde resin, polyacetal and polycarbonate, respectively. These kinds of resin are often used as material of machine parts, toys, various kinds of sheets, structure component parts, pipes and others.

EXPERIMENTAL EXAMPLE 2-1

| Material of test piece: | phenol-formaldehyde resin |
|---|---|
| Sizes of test piece: | 100 mm × 100 mm × 5 mm (thickness) |
| Size of RF electrode 2: | 280 mm in diameter |
| Deposition Conditions | |
| Material gas: | methane (CH$_4$), 50 sccm |
| RF power: | 13.56 MHz, 150 W |
| Self-bias voltage: | −80 V |
| Degree of vacuum: | 0.1 Torr |
| Deposition temperature: | 25° C. |
| Deposition time: | 60 minutes |

EXPERIMENTAL EXAMPLE 2-2

| Material of test piece: | polyacetal |
|---|---|
| Sizes of test piece: | 100 mm × 100 mm × 5 mm (thickness) |
| Size of RF electrode 2: | 280 mm in diameter |
| Deposition Conditions | |
| Material gas: | methane (CH$_4$), 50 sccm |
| RF power: | 13.56 MHz, 150 W |
| Self-bias voltage: | −80 V |
| Degree of vacuum: | 0.1 Torr |
| Deposition temperature: | 25° C. |
| Deposition time: | 60 minutes |

EXPERIMENTAL EXAMPLE 2-3

| Material of test piece: | polycarbonate |
|---|---|
| Sizes of test piece: | 100 mm × 100 mm × 5 mm (thickness) |
| Size of RF electrode 2: | 280 mm in diameter |
| Deposition Conditions | |
| Material gas: | methane (CH$_4$), 50 sccm |
| RF power: | 13.56 MHz, 150 W |
| Self-bias voltage: | −80 V |
| Degree of vacuum: | 0.1 Torr |
| Deposition temperature: | 25° C. |
| Deposition time: | 60 minutes |

Evaluation of the friction coefficients with respect to an aluminum member was performed on the test pieces coated with the DLC films in the experimental examples 2-1, 2-2 and 2-3 as Well as similar but untreated test pieces (test pieces in comparative experimental examples 2-1, 2-2 and 2-3) which were not coated with a DLC film but with silicon oil applied thereto.

The friction coefficients were measured in such a manner that a tip end of a pin-like object made of aluminum and having a tip end of 18 mm in curvature radius was brought into contact with the test piece surface, and the pin was moved at a speed of 20 mm/sec with a load of 10 grams applied to the pin-like object.

The results are shown in the following table.

|  | F/C-1 | F/C-1000 |
|---|---|---|
| Ex 2-1 | 2.64 | 2.66 |
| CE 2-1 | 2.56 | 10.4 |
| Ex 2-2 | 1.22 | 1.35 |
| CE 2-2 | 1.54 | 6.8 |
| EX 2-3 | 2.29 | 2.33 |
| CE 2-3 | 2.44 | 5.04 |

F/C-1: friction coefficient after 1 friction operation
F/C-1000: friction coefficient after 1000 friction operations.

As can be seen from the above, the comparative experimental examples 2-1, 2-2 and 2-3 exhibited small friction coefficients and therefore good lubricities (sliding properties) similar to the experimental examples 2-1, 2-2 and 2-3 of the invention when measured immediately after the start of the friction motion. However, they exhibited large friction coefficients after the friction motion was repeated 1000 times. Conversely, the experimental examples 2-1, 2-2 and 2-3 did not exhibit increase in friction coefficient and maintained a good sliding property (lubricity) even after the friction motion was repeated 1000 times.

Then, evaluation was made by measuring hardnesses of the test pieces coated with the DLC films in the foregoing experimental examples 2-1, 2-2 and 2-3 as well as similar but unprocessed test pieces (comparative experimental examples 2-4, 2-5 and 2-6) not provided with a DLC film. For the test pieces in the experimental examples of the invention, 2-gram Knoop hardness was measured. For the test pieces in the comparative experimental examples, 0.5-gram Knoop hardness was measured.

The results are shown in the following table.

|  | Knoop Hardness |
| --- | --- |
| EX 2-1 | 222 |
| CE 2-4 | 18.4 |
| EX 2-2 | 40.2 |
| CE 2-5 | 12.1 |
| EX 2-3 | 40.2 |
| CE 2-6 | 10.8 |

From the above, it can be understood that the test pieces coated with the DLC films in the experimental examples 2-1, 2-2 and 2-3 have larger hardnesses than the test pieces in the comparative experimental examples 24, 2-5 and 2-6 not coated with a DLC film.

Then, gears of M100-size made of the same material as the test pieces in the experimental examples 2-1, 2-2 and 2-3 were prepared as comparative experimental examples A, B and C. Also, experimental examples A, B and C were prepared by forming DLC films, in the same manner as those in the experimental examples 2-1, 2-2 and 2-3, on the outer surfaces of the same gears, respectively. For these gears, worn depths (i.e., depths of worn portions) of the gears meshed with gears of the same size made of brass were measured after 1000 rotations at a rotation speed of 20 rpm.

The results are shown in the following tables.

|  | Worn Depth ($\mu$m) |
| --- | --- |
| EX A | 0.5 |
| CE A | 5.5 |
| EX B | 0.8 |
| CE B | 3.6 |
| EX C | 0.9 |
| CX C | 3.7 |

From the above, it can be understood that the gears coated with the DLC films in the experimental examples A, B and C have good resistances against wear.

Then, evaluation of the film adhesion properties was performed on following experimental examples 2-4, 2-5, 2-6, 2-7 and 2-8. In these examples, the test pieces coated with DLC films were the same as that in the test piece with the DLC film in the experimental example 2-1, but were pretreated by the plasma under the following conditions. The film adhesion properties were evaluated by a pulling jig method. In this method, a columnar object of 5 mm in diameter made of stainless steel (SUS304) which was joined to a DLC film by adhesive was pulled perpendicularly to the film for removing the film from the test piece, and a force required for removal of the film was measured.

Pretreatment Conditions

EXPERIMENTAL EXAMPLE 2-4

| Pretreatment gas: | hydrogen ($H_2$), 50 sccm |
| --- | --- |
| RF power: | 13.56 MHz, 150 W |
| Self-bias voltage: | −80 V |
| Degree of vacuum: | 0.1 Torr |
| Deposition temperature: | 25° C. |
| Deposition time: | 60 minutes |

EXPERIMENTAL EXAMPLE 2-5

| Pretreatment gas: | sulfur hexafluoride ($SF_6$), 50 sccm |
| --- | --- |
| RF power: | 13.56 MHz, 150 W |
| Self-bias voltage: | −80 V |
| Degree of vacuum: | 0.1 Torr |
| Deposition temperature: | 25° C. |
| Deposition time: | 60 minutes |

EXPERIMENTAL EXAMPLE 2-6

| Pretreatment gas: | oxygen ($O_2$), 50 sccm |
| --- | --- |
| RF power: | 13.56 MHz, 150 W |
| Self-bias voltage: | −80 V |
| Degree of vacuum: | 0.1 Torr |
| Deposition temperature: | 25° C. |
| Deposition time: | 60 minutes |

EXPERIMENTAL EXAMPLE 2-7

After the pretreatment with the oxygen gas plasma in the experimental example 2-6, the pretreatment was performed with the hydrogen gas in the experimental example 2-4.

EXPERIMENTAL EXAMPLE 2-8

After the pretreatment with the oxygen gas plasma in the experimental example 2-6, the pretreatment was performed with the SF6 gas in the experimental example 2-5.

The results are shown in the following table.

|  | Film Adhesion Strength (N) |
| --- | --- |
| EX 2-1 | 3 |
| EX 2-4 | 5 |
| EX 2-5 | 5 |
| EX 2-6 | 6 |
| EX 2-7 | 7 |
| EX 2-8 | 8 |

Then, evaluation was performed by measuring water repellencies of the test pieces coated with the DLC films in the experimental examples 2-1. 2-2 and 2-3 as well as similar but untreated test pieces (comparative experimental examples 2-7, 2-8 and 2-9) not coated with a DLC film. The water repellencies was evaluated similarly to the manner already described, and therefore by measuring contact angles at waterdrops located on the test pieces.

The results are shown in the following table.

|  | Contact Angle (degrees) |
| --- | --- |
| EX 2-1 | 100 |
| CE 2-7 | 90 |
| EX 2-2 | 97 |
| CE 2-8 | 85 |
| EX 2-3 | 92 |
| CE 2-9 | 80 |

As can be understood from the above, the test pieces in the experimental examples 2-1, 2-2 and 2-3 coated with the DLC films exhibited larger contact angles of water than those in the comparative experimental examples 2-7, 2-8 and 2-9 not coated with a DLC film, and therefore exhibited better water repellencies.

Figure 3:
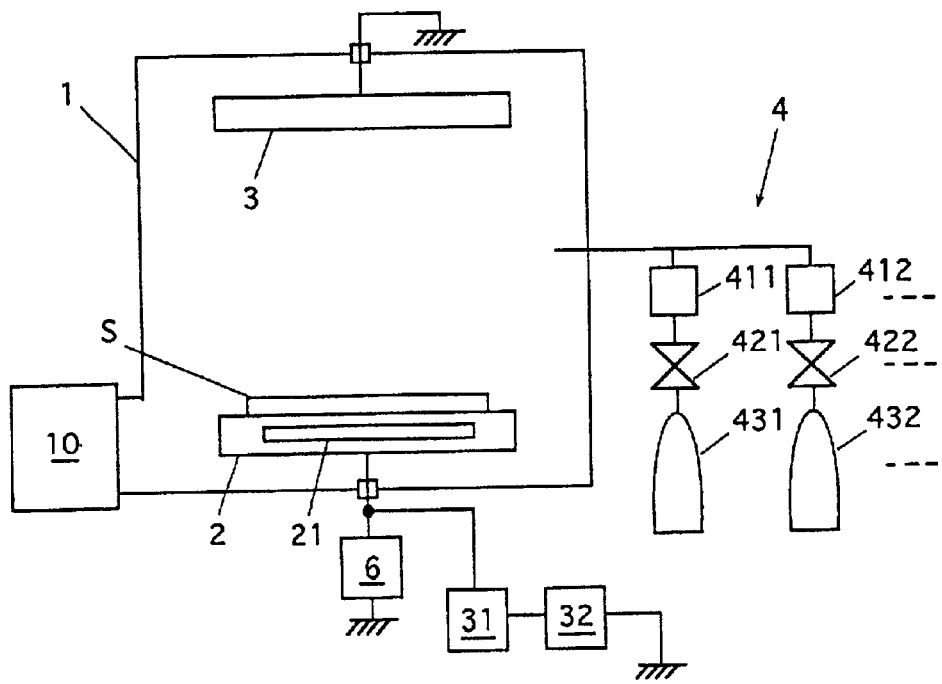
FIG. 3 shows a basic structure of still another example of a plasma CVD apparatus for depositing a carbon film.

The plasma CVD apparatus shown in FIG. 3 differs from the apparatus in FIG. 1 in that a DC power source 6 is connected to the electrode 2 also serving as an object holder in parallel with a series circuit formed of the matching box 31 and the RF power source 32. Structures other than the above are the same as those in the apparatus in FIG. 1, and the same or similar portions bear the same reference numbers.

For forming a carbon film with this apparatus, the deposition target object S is transported into the vacuum container 1 by an unillustrated object transporting device, and is mounted on the electrode 2. The exhaust device 10 operates to achieve a predetermined degree of vacuum in the container 1, and the gas supply unit 4 supplies the deposition material gas into the container 1. The electrode 2 is supplied with an RF power from the RF power source 32 through the matching box 31 and is also supplied with a DC power (usually negative) from the power source 6. Thereby, the plasma is produced from the introduced deposition material gas, and a predetermined film is deposited on the object S in the plasma thus produced.

According to the plasma CVD method and apparatus, the electrode 2 also serving as the object holder is supplied with the DC power for forming a plasma from the deposition material gas, so that ionized particles in the plasma are accelerated toward the object S during the deposition. Therefore, it is possible to deposit the film having a good adherence to the object S.

Figure 4:
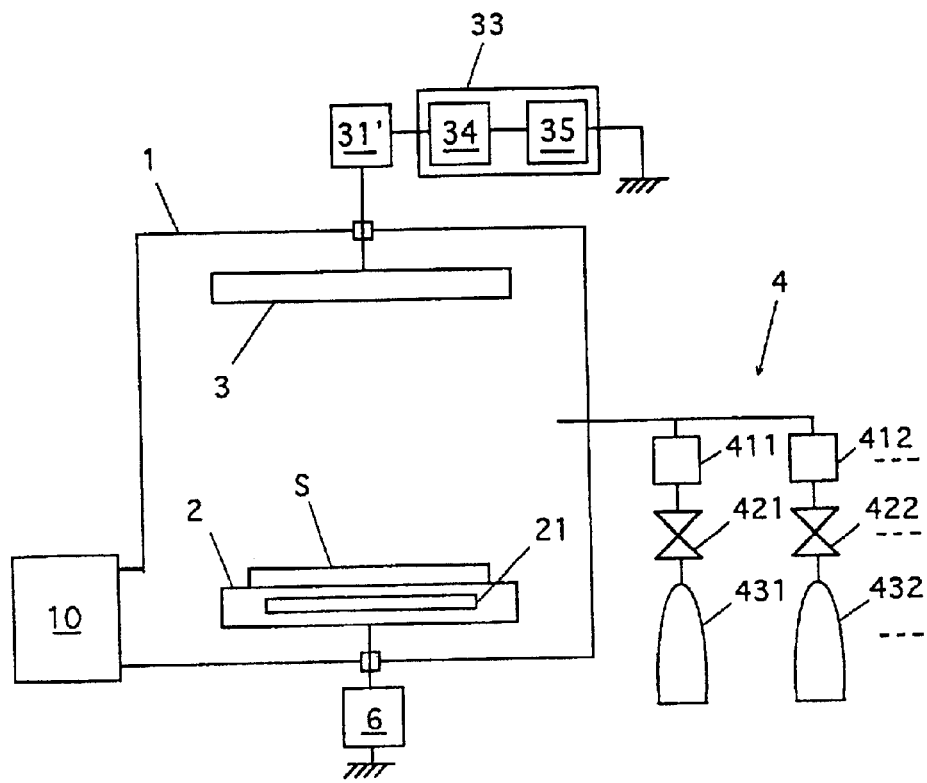
FIG. 4 shows a basic structure of yet another example of a plasma CVD apparatus for depositing a carbon film.

The plasma CVD apparatus shown in FIG. 4 differs from the apparatus shown in FIG. 1 in that the electrode 2 also serving as an object holder is connected to the DC power source 6 and that the electrode 3 is connected to an RF power generating device 33 via a matching box 31'. The device 33 includes an RF power amplifier 34 and an RF arbitrary waveform generating device 35 connected thereto. Structures other than the above are the same as those in the apparatus in FIG. 1, and the same or similar portions bear the same reference numbers.

For forming a carbon film with this apparatus, the electrode 3 is supplied with a pulse-modulated RF power prepared from the RF power generating device 33 through the matching box 31, and simultaneously the electrode 2 is supplied with a DC power (usually negative) from the power source 6. In this manner, a plasma is formed from the material gas.

The pulse-modulated RF power applied to the electrode may be prepared in such a manner that the pulse modulation is effected on the basic RF power of a frequency from 10 MHz to 100 MHz (e.g., of 13.56 MHz) with the modulation frequency from 100 Hz to 10 MHz (e.g., from 1 kHz to 100 kHz). The duty ratio (on-time/(on-time+off-time)) is determined in a range from 10% to 90%. Deposition operations other than the above are the same as those in the deposition by the apparatus in FIG. 1.

According to the plasma CVD method and apparatus, the pulse-modulated RF power is applied to the electrode 3 opposed to the electrode 2 also serving as the object holder, and simultaneously the DC power is applied to the electrode 2 serving as the object holder, so that a plasma is formed from the deposition material gas. As a result, the plasma can have a high density, therefore a heating temperature of the object S which is heated by the temperature controller 21 through the electrode 2 can be low. Also, ionized particles in the plasma are accelerated toward the object S during the deposition, so that the film can have a good adherence to the object S.

Figure 5:
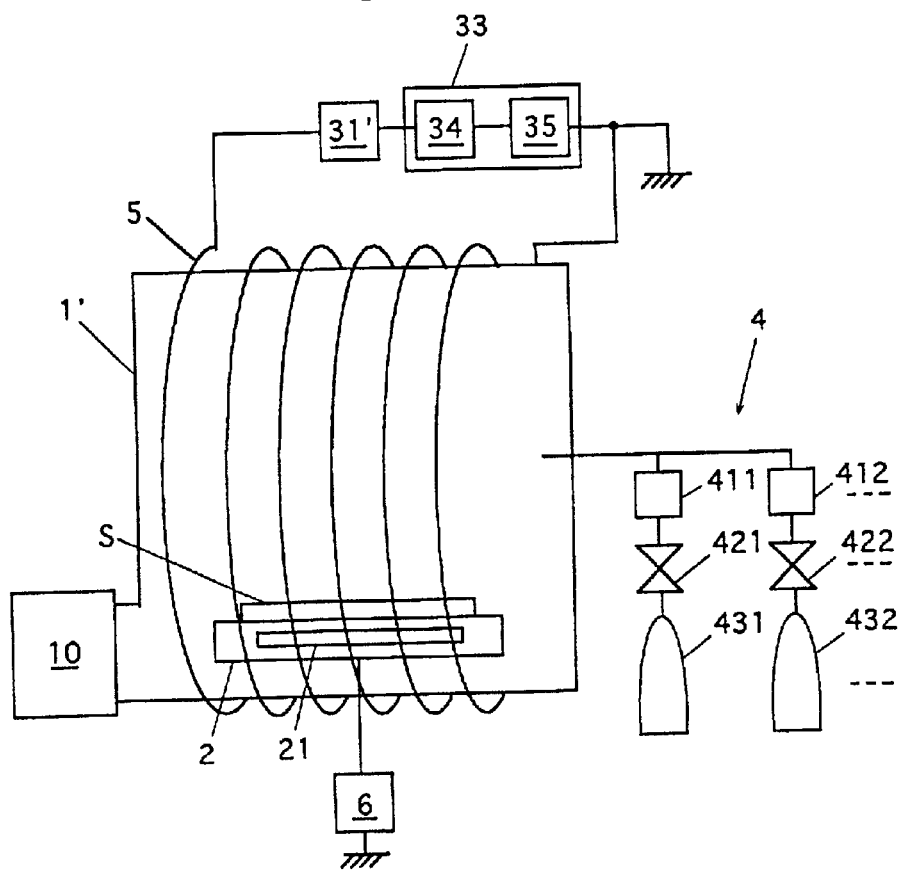
FIG. 5 shows a basic structure of a further another example of a plasma CVD apparatus for depositing a carbon film.

The plasma CVD apparatus shown in FIG. 5 differs from the apparatus shown in FIG. 2 in that the RF power generating device 33 is employed instead of the RF power source 52, and is connected to the coil electrode 5 through the matching box 31'. The electrode 2 also serving as the object holder is arranged in the container 1' instead of the temperature controller 21', and is connected to the DC power source 6. Structures other than the above are the same as those in the apparatus in FIG. 2, and the same or similar portions bear the same reference numbers.

For forming a carbon film with this apparatus, the pulse-modulated RF power is applied to the induction coil electrode 5, and simultaneously the DC power (usually negative) is applied to the electrode 2 for forming a plasma from the material gas. Deposition operations other than the above are similar to those by the apparatus in FIG. 2.

Deposition by this apparatus can achieve an effect similar to that by the apparatus in FIG. 4.

Figure 6:
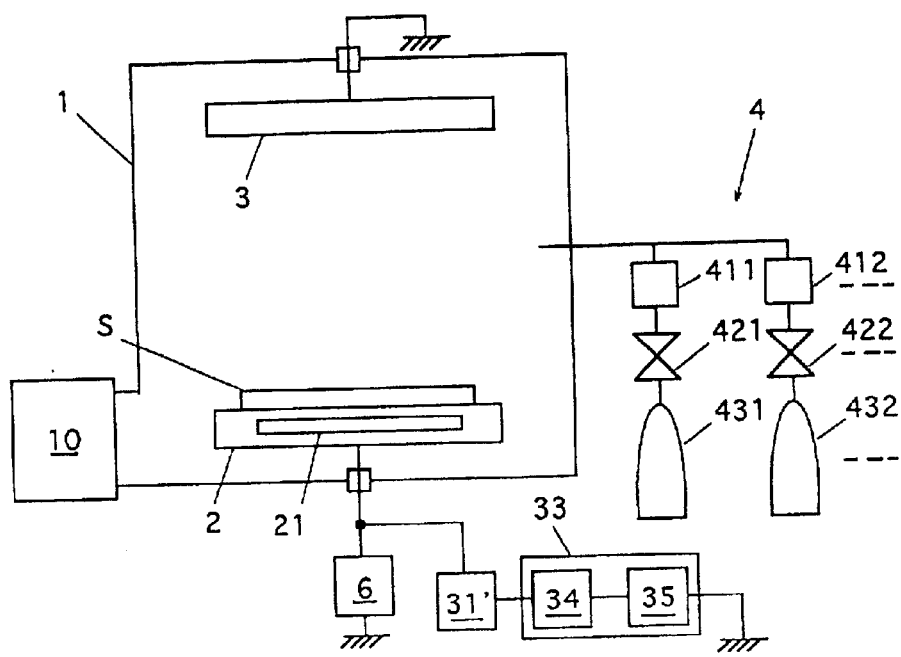
FIG. 6 shows a basic structure of a further example of a plasma CVD apparatus for depositing a carbon film.

The plasma CVD apparatus shown in FIG. 6 differs from the apparatus shown in FIG. 1 in that the RF power generating device 33 is employed instead of the RF power source 23, and is connected through the matching box 31, to the electrode 2 also serving as the object holder. In addition to this, the DC power source 6 is connected in parallel with the matching box 31, and the device 33. Structures other than the above are the same as those in the apparatus in FIG. 1, and the same or similar portions bear the same reference numbers.

For forming a carbon film with this apparatus, formation of the plasma from the deposition material gas is performed by applying the DC power to the electrode 2 also serving as the object holder from the power source 6 and by applying simultaneously the pulse-modulated RF power from the RF power generating device 33, and thus is performed by applying both the powers in a superposed manner. Deposition operations other than the above are similar to those by the apparatus in FIG. 1.

According to the above manner and structure, ionized particles in the plasma are accelerated further strongly toward the object S, so that the deposited film can have a further improved adherence.

Figure 7:
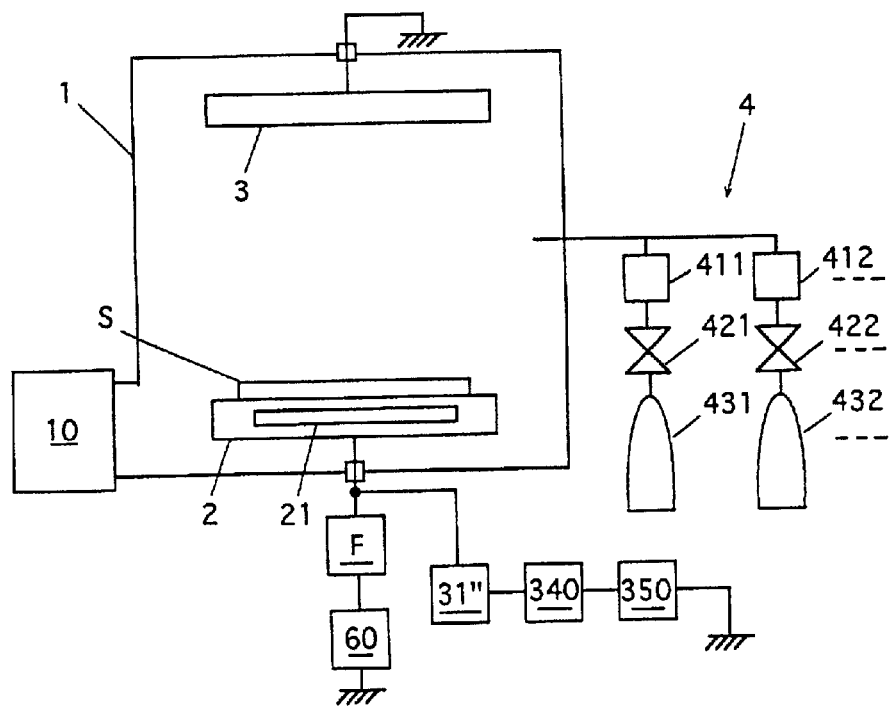
FIG. 7 shows a basic structure of a further example of a plasma CVD apparatus for depositing a carbon film.

The plasma CVD apparatus shown in FIG. 7 differs from the apparatus shown in FIG. 1 in that the matching box 31", an RF power source 340 and an arbitrary waveform forming device 350 are connected in series to the electrode 2 also serving as the object holder, and a circuit formed of a low-pass filter F and a DC power source 60 is connected in parallel with this series circuit. Filter F prevents flow of an RF current to the DC power source 60. Structures other than the above are the same as those in the apparatus in FIG. 1, and the same or similar portions bear the same reference numbers.

The DC power sources 6 used in the apparatuses in FIGS. 3 and 6 also employ low-pass filters similar to the above.

In the apparatus shown in FIG. 7, the pulse-modulated RF power and the DC power are applied in a superposed manner to the electrode 2, similarly to the foregoing apparatus. The deposition operation and effect of this apparatus are similar to those of the apparatus in FIG. 6.

Figure 8:
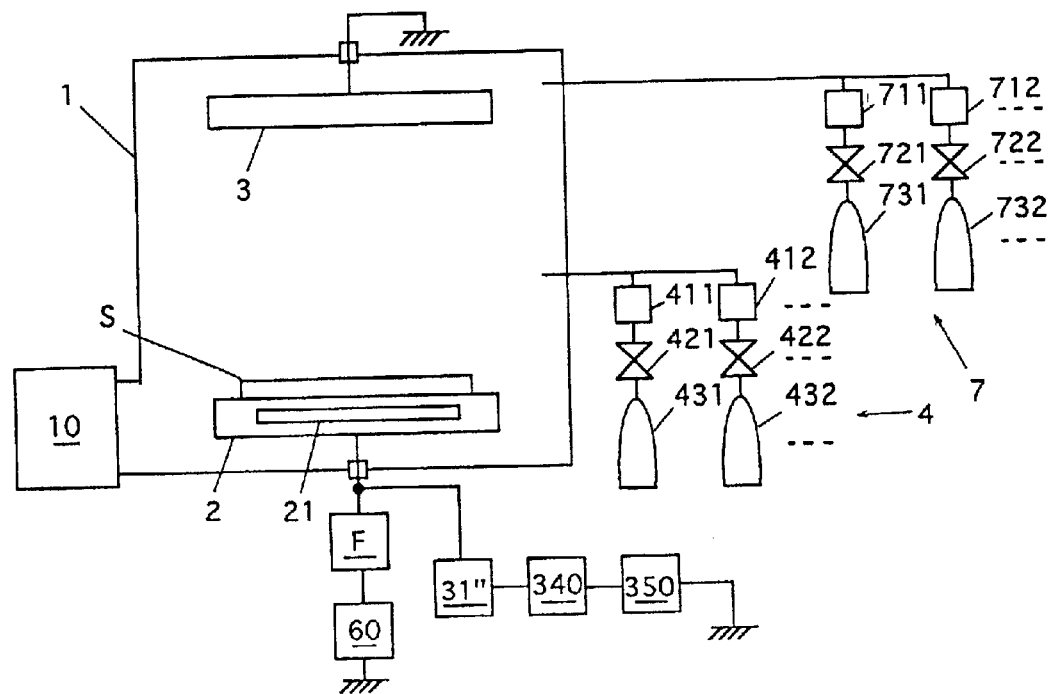
FIG. 8 shows a basic structure of a further example of a plasma CVD apparatus for depositing a carbon film.

The plasma CVD apparatus shown in FIG. 8 differs from the apparatus in FIG. 7 in that a pretreatment gas supply unit 7 is connected to the vacuum container 1 to which the deposition material gas supply unit 4 is also connected. The gas supply unit 7 can supply one or more of a fluorine-contained gas, a hydrogen gas and an oxygen gas, and is of one or more gas sources 731, 732, of the pretreatment gases connected through mass-flow controllers 711, 712, . . . and valves 721, 722, . . . , respectively. Structures other than the above are the same as those in the apparatus in FIG. 7, and the same or similar portions bear the same reference numbers.

For forming a carbon film with this apparatus, the object S is carried by the electrode 2, and the exhaust device 10 operates to attain a predetermined degree of vacuum in the container 1. As a pretreatment gas, one or more kinds of gases selected from the fluorine-contained gas, hydrogen gas and oxygen gas are introduced from the pretreatment gas supply 7 into the container 1, and the RF power is supplied to the electrode 2, whereby a plasma is formed from the introduced pretreatment gas, and the surface treatment is effected on the object S under the plasma. Formation of the plasma from the pretreatment gas, which is performed by application of the modulated RF power in the above manner, may be performed by application of the steady RF power.

Then, similarly to the deposition by the apparatus shown in FIG. 7, the deposition material gas is introduced from the gas supply unit 4 into the container 1, and the plasma is formed from the deposition material gas by applying the pulse-modulated RF power and the DC power in a superposed manner to the electrode 2. Thereby, a predetermined film is formed on the object S.

According to the CVD method and apparatus described above, the surface to be deposited of the object S which is made of an organic material or a glass may be exposed to one or more of the fluorine-contained gas plasma, hydrogen gas plasma and oxygen gas plasma prior to the deposition. Thereby, the surface of the object S is cleaned, and the surface roughness of the object S is improved. Further, if the fluorine-contained gas plasma and/or hydrogen gas plasma are employed, fluorine termination and/or hydrogen termination are effected at the surface of the object S. If the oxygen gas plasma is employed, contaminants such as organic matters sticking onto the surface of the object S can be removed particularly efficiently. Therefore, the carbon film can have a further improved adherence to the object S.

Figure 9:
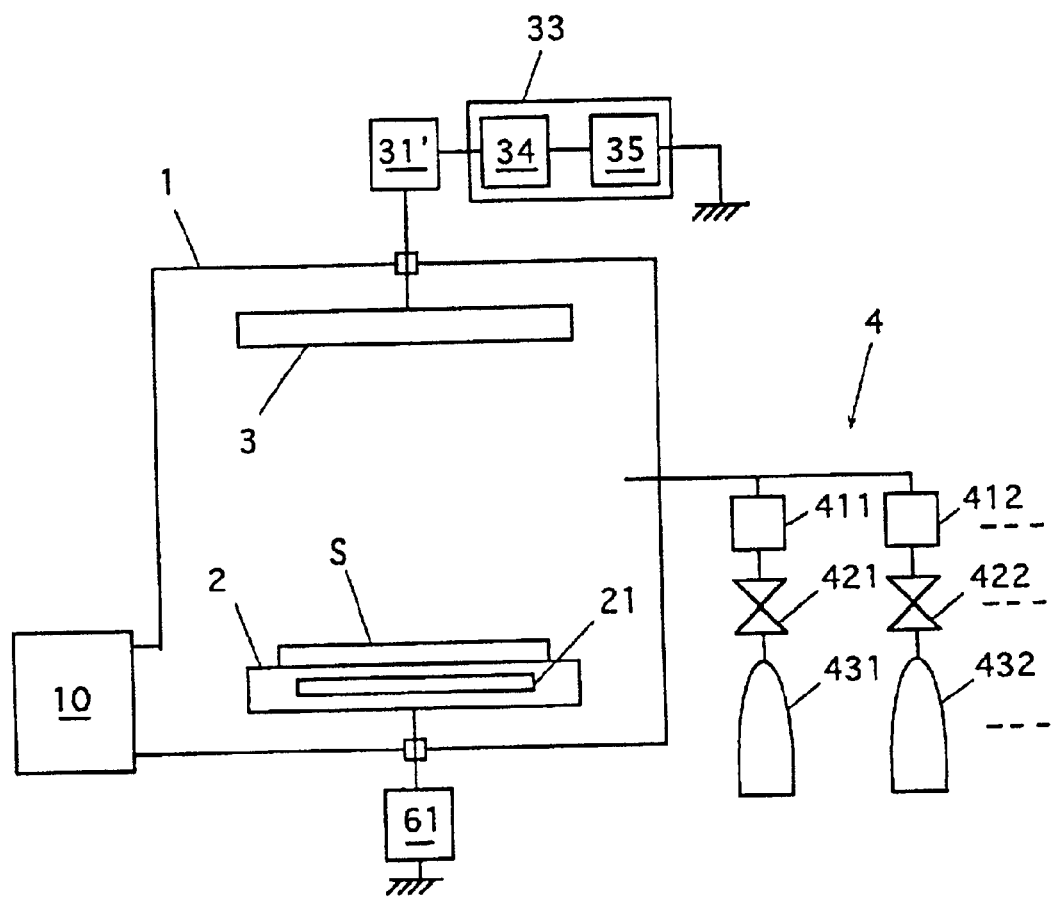
FIG. 9 shows a basic structure of a further example of a plasma CVD apparatus for depositing a carbon film.

The plasma CVD apparatus shown in FIG. 9 differs from the apparatus shown in FIG. 4 in that the DC power source 6 is replaced with a DC power source device 61 allowing turn on/off of the power. Structures other than the above are the same as those in the apparatus in FIG. 4, and the same or similar portions bear the same reference numbers.

For forming a carbon film with the this apparatus, a plasma is formed from the deposition material gas by applying the pulse-modulated RF power to the electrode 3 opposed to the electrode 2 also serving as the object holder and by simultaneously applying the DC power in the pulse form to the electrode 2 also serving as the object holder. The pulse frequency of the DC power in the pulse form is in a range from 1 kHz to 100 kHz, and the duty ratio is in a range from 10 to 90%.

Thereby, the plasma thus obtained can have a higher density than that by the apparatus in FIG. 4, and therefore the heating temperature of the object s by the temperature controller 21 can be further reduced. Also, ionized particles in the plasma can be accelerated further strongly toward the object S, and thus the deposited film can have a further improved adherence to the object S.

Although not shown, the apparatuses in FIG. 3 and FIGS. 5 to 8 may employ a DC power source device allowing turn on/off of the power instead of the DC power sources 6 and 60. This can further lower the heating temperature of the object S by the temperature controller 21, compared with the apparatuses in FIG. 3 and FIGS. 5 to 8, and the deposited films can have a further improved adherence to the object S.

Although not shown, the apparatuses in FIGS. 3 to 6 and FIG. 9 may employ the pretreatment gas supply unit 7.

Description will now be given on other experimental examples of deposition of carbon films by any of apparatuses shown in FIGS. 3 to 9 as well as comparative experimental examples. All of these examples commonly employ the apparatus condition that the electrode 2 has a diameter of 280 mm. Experimental example 3-1 The apparatus in FIG. 3 was used to form a DLC film on the test piece S made of silicon. The DLC film was formed of an interface layer in contact with the test piece S and an upper layer. The interface layer was deposited by applying a steady RF power and a DC power in a superposed manner to the electrode 2 also serving as the object holder. The upper layer was deposited by applying only the steady RF power to the electrode 2.

| DEPOSITION CONDITIONS | |
| --- | --- |
| Test Piece S | material: silicon |
| | size (diameter): 4 inches |
| RF Power: | frequency 13.56 MHz, 150 W |
| Self-Bias Voltage: | −80 V |
| DC Bias Voltage: | −350 V (only for interface layer) |
| Deposition material Gas: | $CH_4$, 50 sccm |
| Deposition Pressure: | 0.1 Torr |
| Deposition Temperature: | 25° C. |
| Deposition Time: | 5 minutes (interface layer) |
| | 55 minutes (upper layer) |

EXPERIMENTAL EXAMPLE 3-2

The apparatus in FIG. 7 was used to form a DLC film on the test piece S made of silicon. The DLC film was formed of an interface layer in contact with the test piece S and an upper layer. The interface layer was deposited by applying a pulse-modulated RF power and a DC power in a superposed manner to the electrode 2 also serving as the object holder. The upper layer was deposited by applying only the steady RF power to the electrode 2.

| DEPOSITION CONDITIONS | |
| --- | --- |
| Test Piece S | material: silicon |
| | size (diameter): 4 inches |
| RF Power | |
| For Interface Layer: | Basic RF power of 13.56 MHz and 150 W was pulse-modulated with modulation frequency of 100 kHz and duty ratio of 50%. |
| For Upper Layer: | Steady RF power of 13.56 MHz and 150 W. |
| Self-Bias Voltage: | −80 V |
| DC Bias Voltage: | −350 V (only for interface layer) |
| Deposition Material Gas: | $CH_4$, 50 sccm |
| Deposition Pressure: | 0.1 Torr |
| Deposition Temperature: | 25° C. |
| Deposition Time: | 7.5 minutes (interface layer) |
| | 55 minutes (upper layer) |

COMPARATIVE EXPERIMENTAL EXAMPLE 3-1

The apparatus in FIG. 1 was used to form a DLC film on the test piece S made of silicon by applying a steady RF power to the electrode 2. The DLC film was deposited under the same conditions as those for deposition of the upper layers in the foregoing experimental examples 3-1 and 3-2.

| DEPOSITION CONDITIONS | |
|---|---|
| Test Piece S | material: silicon |
|  | size (diameter): 4 inches |
| RF Power: | 13.56 MHz, 150 W |
| Self-Bias voltage: | −80 V |
| Deposition Material Gas: | $CH_4$, 50 sccm |
| Deposition Pressure: | 0.1 Torr |
| Deposition Temperature: | 25° C. |
| Deposition Time: | 60 minutes |

The film stresses and film adherence strengths of the DLC films deposited in the experimental examples 3-1 and 3-2 as well as the comparative experimental example 3-1 were measured. The results are shown below. Deposition rates in these examples are also shown. The film stresses were measured with a laser-type displacement measuring device (manufactured by Flexus Corp., 500), and the adherence strengths of the films were measured with a microscratch device (manufactured by CSEM Corp., Levetester).

|  | Film Stress ($dyne/cm^2$) | Adherence Strength (N) | Deposition Rate (Å/min) |
|---|---|---|---|
| E3-1 | $9.2 \times 10^9$ | 17 | 30; 60* |
| E3-2 | $8.5 \times 10^9$ | 18 | 20; 60* |
| C3-1 | $7.2 \times 10^9$ | 12 | 60 |

From the results, it can be found that the DLC films in the experimental examples 3-1 and 3-2 deposited with applying the DC bias voltage to the electrode 2 also serving as the object holder have considerably large film adherence strengths compared with the DLC film in the comparative experimental example 3-1 not employing the DC bias.

EXPERIMENTAL EXAMPLE 3-3

The apparatus in FIG. 3 was used, and a DLC film was formed on the test piece S made of a silicone resin which is a thermosetting resin. The DLC film was formed of an interface layer in contact with test piece S and an upper layer. The interface layer was deposited by applying a steady RF power and a DC power in a superposed manner to the electrode 2. The upper layer was deposited by applying only the steady RF power to the electrode 2.

| DEPOSITION CONDITIONS | |
|---|---|
| Test Piece S | |
| material: | silicone resin |
| size: | 100 mm × 100 mm × 5 mm (thickness) |
| RF Power: | 13.56 MHz, 150 W |
| Self-Bias Voltage: | −80 V |
| DC Bias voltage: | −350 V (only for interface layer) |
| Deposition Material Gas: | $CH_4$, 50 sccm |
| Deposition Pressure: | 0.1 Torr |
| Deposition Temperature: | 25° C. |
| Deposition Time: | 2 minutes (for interface layer) |
|  | 16 minutes (for upper layer) |

EXPERIMENTAL EXAMPLE 3-4

The apparatus in FIG. 7 was used, and a DLC film was formed on the test piece S made of a silicone resin which is a thermosetting resin. The DLC film was formed of an interface layer and an upper layer. The interface layer was deposited by applying a pulse-modulated RF power and a DC power in a superposed manner to the electrode 2. The upper layer was deposited by applying only the steady RF power to the electrode 2.

| DEPOSITION CONDITIONS | |
|---|---|
| Test Piece S | |
| material: | silicone resin |
| size: | 100 mm × 100 mm × 5 mm (thickness) |
| RF Power | |
| For Interface Layer: | Basic RF power of 13.56 MHz and 150 W was pulse-modulated with modulation frequency of 100 kHz and duty ratio of 50%. |
| For Upper Layer: | Steady RF power of 13.56 MHz and 150 W. |
| Self-Bias Voltage: | −80 V |
| DC Bias voltage: | −350 V (only for interface layer) |
| Deposition Material Gas: | $CH_4$, 50 sccm |
| Deposition Pressure: | 0.1 Torr |
| Deposition Temperature: | 25° C. |
| Deposition Time: | 2.5 minutes (interface layer) |
|  | 16 minutes (upper layer) |

COMPARATIVE EXPERIMENTAL EXAMPLE 3-2

The apparatus in FIG. 1 was used to form a DLC film on the test piece S made of silicone resin, which is a thermosetting resin, by applying a steady RF power to the electrode 2. The DLC film was deposited under the same conditions as those for deposition of the upper layers in the foregoing experimental examples 3-3 and 3-4.

| DEPOSITION CONDITIONS | |
|---|---|
| Test Piece S | |
| material: | silicone resin |
| size: | 100 mm × 100 mm × 5 mm (thickness) |
| RF Power: | 13.56 MHz, 150 W |
| Self-Bias Voltage: | −80 V |
| Deposition Material Gas: | $CH_4$, 50 sccm |
| Deposition Pressure: | 0.1 Torr |
| Deposition Temperature: | 25° C. |
| Deposition Time: | 17 minutes |

The film stresses and film adherence strengths of the DLC films deposited in the experimental examples 3-3 and 3-4 and the comparative experimental example 3-2 were measured. The results are shown below. Deposition rates in these examples are also shown. The film stresses were measured with the laser-type displacement measuring device already described, and the adherence strengths of the films were measured with the microscratch device already described.

|  | Film Stress ($dyne/cm^2$) | Adherence Strength (N) | Deposition Rate (Å/min) |
|---|---|---|---|
| E3-3 | $8.2 \times 10^9$ | 8 | 150; 300* |
| E3-4 | $7.5 \times 10^9$ | 9 | 120; 300* |
| C3-2 | $6.2 \times 10^9$ | 5 | 300 |

*:interface layer deposition; upper layer deposition

From the results, it can be found that the DLC films in the experimental examples 3-3 and 3-4 deposited by applying the DC bias voltage to the electrode also serving as the object holder have considerably large film adherence strengths compared with the DLC film in the comparative experimental example 3-2 not employing the DC bias voltage.

Measurement was made to determine friction coefficients of the test pieces coated with the DLC films which were obtained by the experimental examples 3-3 and 3-4 and the comparative experimental example 3-2 as well as the test piece S made of the same silicone resin as those of the examples, which was coated with silicone oil, i.e., lubricant (comparative experimental example X), and more specifically the friction coefficients between these test pieces with respect to an object made of PTFE (polytetrafluoroethylene) were measured. The friction coefficients were measured in such a manner that the other object made of PTFE having a tip curvature of R18 was laid on the test piece coated with the DLC film, and a weight of 10 grams was laid on the other object with an acrylic plate therebetween. The friction coefficients were also measured after repetitively sliding (1000 times and 5000 times) the other object made of PTFE with respect to the same portions of the test pieces coated with the DLC films at a speed of 50 mm/minute. The results are shown below.

|  | Friction Coefficient | | |
| --- | --- | --- | --- |
|  | Initial | 1000 times | 5000 times |
| E3-3 | 0.56 | 0.56 | 0.58 |
| E3-4 | 0.54 | 0.55 | 0.56 |
| C3-2 | 0.55 | 0.57 | 1.50 (peeling) |
| CX | 0.54 | 2.52 | 4.50 |

The following can be understood from the results. The friction coefficient of the test piece of the comparative example X coated with lubricant was deteriorated with increase in number of sliding with respect to the other object. Conversely, according to each of the test pieces coated with the DLC films in the experimental examples 3-3 and 3-4 having the interface layers which were deposited employing the superposed DC bias voltages, deterioration of the friction coefficients was not found. According to the test piece coated with the DLC film in the comparative experimental example 3-2 which did not employ the DC bias voltage, the film was partially peeled off and the friction coefficient was deteriorated when the sliding occurred 5000 times.

As described above, the DLC film made of the interface layer and the upper layer was deposited over the object made of thermosetting resin, and the DC bias voltage was applied when depositing the interface layer. Thereby, the hard DLC film can be deposited with a good adherence on the object made of a resin, i.e., the softer object than the metal object. Therefore, it can be found that the object had a durable lubricity.

EXPERIMENTAL EXAMPLE 3-5

The apparatus in FIG. 3 was used to form a DLC film on the test piece S made of polytetrafluoroethylene (PTFE) which is a thermoplastic resin. The DLC film was formed of an interface layer in contact with the test piece S and an upper layer. The interface layer was deposited by applying a steady RF power and a DC power in a superposed manner to the electrode 2. The upper layer was deposited by applying only the steady RF power to the electrode 2.

| DEPOSITION CONDITIONS | |
| --- | --- |
| Test Piece S | |
| material: | PTFE |
| size: | 100 mm × 100 mm × 5 mm (thickness) |
| RF Power: | 13.56 MHz, 150 W (for interface layer) |
| Self-Bias Voltage: | −80 V |
| DC bias Power: | −350 (only for interface layer) |
| Deposition Material Gas: | $CH_4$, 50 sccm |
| Deposition Pressure: | 0.1 Torr |
| Deposition Temperature: | 25° C. |
| Deposition Time: | 2 minutes (interface layer) |
|  | 24 minutes (upper layer) |

EXPERIMENTAL EXAMPLE 3-6

The apparatus in FIG. 7 was used to form a DLC film on the test piece S made of PTFE which is a thermoplastic resin. The DLC film was formed of an interface layer and an upper layer. The interface layer was deposited by applying a pulse-modulated RF power and a DC power in a superposed manner to the electrode 2. The upper layer was deposited by applying only the steady DC power to the electrode 2.

| DEPOSITION CONDITIONS | |
| --- | --- |
| Test Piece S | |
| material: | PTFE |
| size: | 100 mm × 100 mm × 5 mm (thickness) |
| RF Power | |
| For Interface Layer: | Basic RF power of 13.56 MHz and 150 W was pulse-modulated with modulation frequency of 100 kHz and duty ratio of 50%. |
| For Upper Layer: | Steady RF power of 13.56 MHz and 150 W. |
| Self-Bias Voltage: | −80 V |
| DC Bias Voltage: | −350 V (only for interface layer) |
| Deposition material Gas: | $CH_4$, 50 sccm |
| Deposition Pressure: | 0.1 Torr |
| Deposition Temperature: | 25° C. |
| Deposition Time: | 2.5 minutes (interface layer) |
|  | 24 minutes (upper layer) |

COMPARATIVE EXPERIMENTAL EXAMPLE 3-3

The apparatus in FIG. 1 was used to form a DLC film on the test piece S made of PTFE, which is a thermoplastic resin, with a plasma formed from a deposition material gas by applying a steady RF power. The DLC film was deposited under the same conditions as those for deposition of the upper layers in the foregoing experimental examples 3-5 and 3-6.

| DEPOSITION CONDITIONS | |
| --- | --- |
| Test Piece S | |
| material: | PTFE |
| size: | 100 mm × 100 mm × 5 mm (thickness) |
| RF Power: | 13.56 MHz and 150 W |
| Self-Bias Voltage: | −80 V |
| Deposition Material Gas: | $CH_4$, 50 sccm |
| Deposition Pressure: | 0.1 Torr |

-continued

| DEPOSITION CONDITIONS | |
|---|---|
| Deposition Temperature: | 25° C. |
| Deposition Time: | 25 minutes |

For the DLC films obtained in the experimental examples 3-5 and 3-6 and the comparative experimental example 3-3, the film stresses and film adherence strengths were measured in the same manner as the foregoing. The results are shown below. Deposition rates in these examples are also shown.

| | Film Stress (dyne/cm$^2$) | Adherence Strength (N) | Deposition Rate (Å/min) |
|---|---|---|---|
| E3-5 | $9.2 \times 10^9$ | 7 | 100; 200* |
| E3-6 | $8.5 \times 10^9$ | 8 | 80; 200* |
| C3-3 | $7.2 \times 10^9$ | 3 | 200 |

The following can be understood from the results. The respective DLC films in the experimental examples 3-5 and 3-6 which were deposited with the DC bias voltage applied to the electrode also serving as the object holder have considerably larger adherence strengths than the DLC film in the comparative experimental example 3-3 which did not employ the DC bias voltage.

Then, measurement was performed in the same manner as the above to determine friction coefficients of the DLC-film coated test pieces obtained in the experimental examples 3-5 and 3-6 and the comparative experimental example 3-3 as well as a test piece S made of PTFE, the same material as the above and was coated with silicone oil, i.e., lubricant (comparative experimental example Y). The results are shown below.

| | Friction Coefficient | | |
|---|---|---|---|
| | Initial | 1000 times | 5000 times |
| E3-5 | 0.56 | 0.56 | 0.58 |
| E3-6 | 0.54 | 0.55 | 0.56 |
| C3-3 | 0.55 | 0.57 | 1.30 (peeling) |
| CY | 0.66 | 1.20 | 2.00 |

The following can be understood from the results. The test piece of the comparative example Y coated with lubricant exhibited the friction coefficient which was deteriorated with increase in number of sliding with respect to the other object. However, each of the DLC film coated test pieces of the experimental examples 3-5 and 3-6 of the invention, which were formed with the DC bias voltage, did not exhibit such deterioration of the friction coefficient. According to the DLC film coated test piece of the comparative experimental example 3-3, which did not employ the DC bias voltage, the film was partially peeled off and the friction coefficient was deteriorated when it slid 5000 times with respect to the other object.

As described above, it can be understood that, similarly to the foregoing case of the object made of the thermosetting resin, the hard DLC film can be deposited on the object made of a relatively soft resin with a good adherence, and thereby the object can have a durable lubricity.

EXPERIMENTAL EXAMPLE 3-7

In the DLC film deposition of the experimental example 3-1 using the apparatus shown in FIG. 3, an ammonia (NH$_3$) gas was added to the deposition material gas immediately before completion of the deposition, so that a carbon nitride layer was formed at the surface portion of the film.

| DEPOSITION CONDITIONS | |
|---|---|
| Test Piece S | |
| material: | silicon |
| size (diameter): | 4 inches |
| RF Power | 13.56 MHz, 150 W |
| Self-Bias Voltage: | −80 V |
| DC Bias Voltage: | −350 V (only for interface layer) |
| Deposition material Gas | |
| | For DLC film: CH$_4$, 50 sccm |
| | For nitride layer: CH$_4$, 50 sccm |
| | NH$_3$, 50 sccm Deposition |
| Pressure: | 0.1 Torr |
| Deposition Temperature: | 25° C. |
| Deposition Time | |
| | DLC film: 50 minutes (including 5 minutes for interface layer) |
| | Nitride layer: 10 minutes |

The hardness and film adherence strengths of the DLC film coated test pieces obtained in the experimental examples 3-1 and 3-7 were measured. The results are shown below. The film hardness was determined in Vickers hardness, and the film adherence strength was measured in the same manner as the above.

| Strength (N) | Vickers hardness | Adherence |
|---|---|---|
| E3-7 | 1300 | 17 |
| E3-1 | 1100 | 17 |

It can be understood that the DLC film having the nitride layer at its surface has a higher hardness than the DLC film not having the nitride layer without deteriorating its film adherence.

EXPERIMENTAL EXAMPLE 3-8

In the process similar to that in the foregoing experimental example 3-5 using the apparatus in FIG. 3, pretreatment was effected on the test piece S made of PTFE with a sulfur hexafluoride (SF$_6$) gas plasma prior to the deposition. The deposition conditions were the same as those in the experimental example 3-5.

| PRETREATMENT CONDITION | |
|---|---|
| Pretreatment Gas: | SF$_6$, 50 sccm |
| RF power: | 13.56 MHz, 200 W |
| Processing Vacuum: | 0.1 Torr |
| Processing Time: | 5 minutes |

Then, measurement was made to determine the adherence strength of the DLC film, which was deposited in the experimental example 3-8 effecting the pretreatment with the sulfur hexafluoride (SF$_6$) gas plasma, to the test piece S. The results are shown below. The adherence strength of the DLC film deposited in the experimental example 3-5 to the test piece S is also shown.

|      | Adherence Strength (N) |
|------|------------------------|
| E3-8 | 9                      |
| E3-5 | 7                      |

From the results, it can be found that the DLC film in the experimental example 3-8 employing the pretreatment has a larger adherence strength than the DLC film in the experimental example 3-5.

Any of the plasma CVD apparatuses and deposition of the carbon films by the apparatuses, which have been described with reference to FIGS. 1 to 9, may employ the pretreatment for producing uncombined atoms by irradiation of ultraviolet rays and/or electron rays to the deposition surface of the deposition target object, if the deposition surface is made of polymer material, such as rubber or resin. When ultraviolet rays and/or electron rays are irradiated on rubber or resin, crosslinking occurs at the irradiated surface and simultaneously uncombined carbon are produced.

Figure 10:
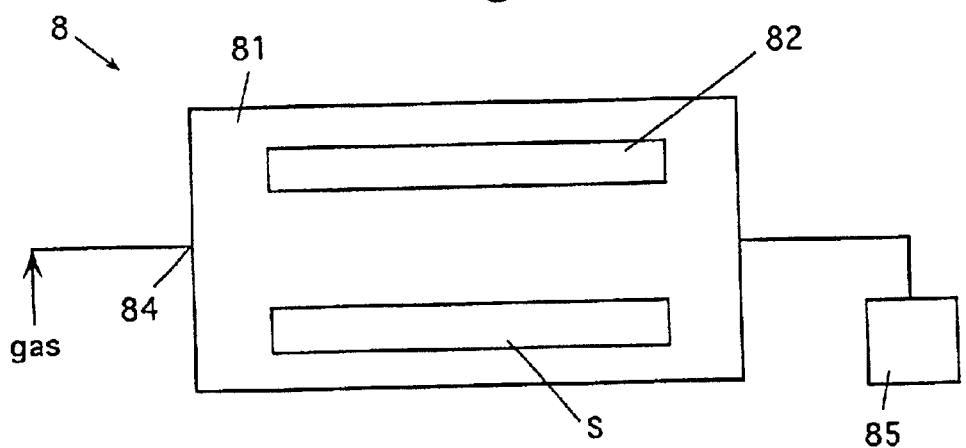
FIG. 10 shows a schematic structure of an example of an ultraviolet ray irradiating device.

FIG. 10 shows an example of an ultraviolet ray irradiating device for irradiation of ultraviolet rays. This apparatus 8 includes an ultraviolet lamp 82 arranged in a sealed container 81. A deposition target object S is arranged at a position opposed to the lamp 82. A gas is supplied from a gas inlet 84 into the sealed container 81. An exhaust pump 85 is arranged for producing a vacuum in the container 81. Ultraviolet rays may be irradiated in a vacuum without supplying a gas. Alternatively, an inert gas (Ar, Kr, Ne or He) or an active gas ($N_2$ or $O_2$) may be supplied, and ultraviolet rays may be irradiated in an atmosphere of such a gas.

Figure 11:
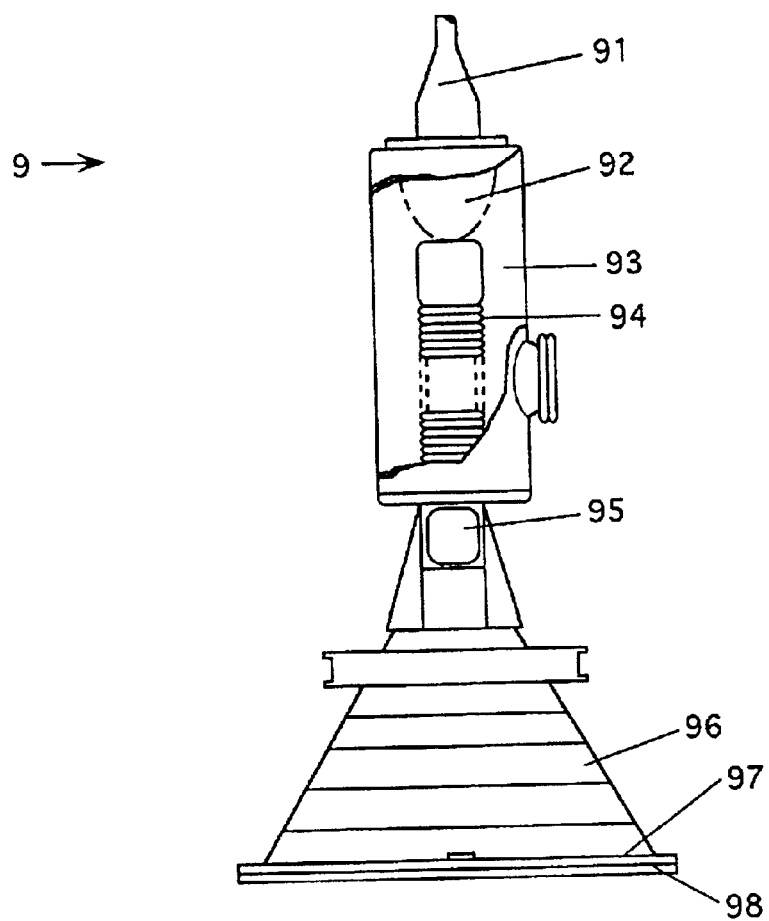
FIG. 11 shows a schematic structure of an example of an electron ray irradiating device.
Figure 12:
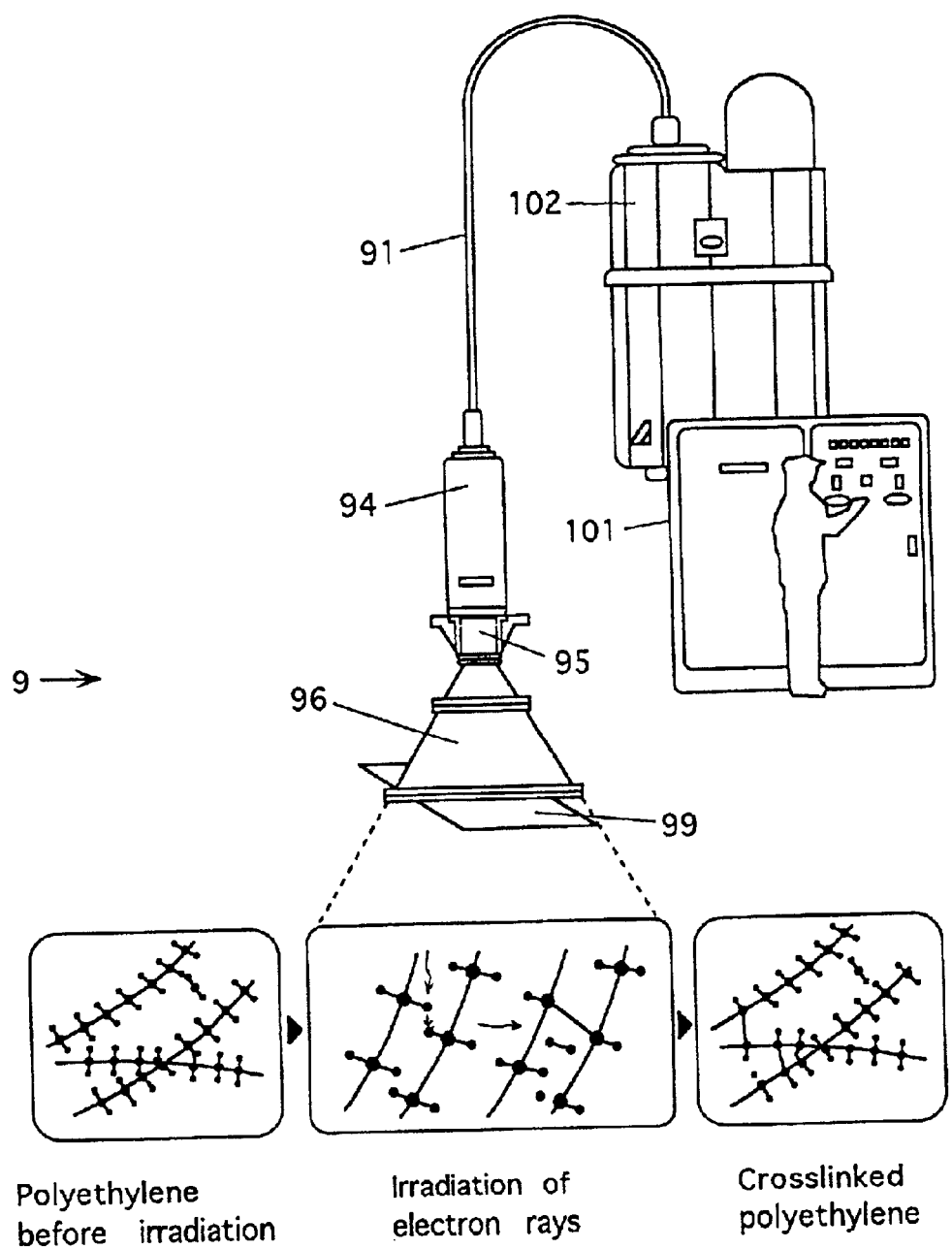
FIG. 12 shows a pretreatment by the electron ray irradiating device.

FIG. 11 shows an example of an electron ray irradiating device for irradiation of electron rays. FIG. 12 shows a pretreatment effected on a deposition surface of an object made of rubber or resin. An apparatus 9 in FIG. 11 has a vertically long structure, and includes a DC high-voltage cable 91, a bushing 92, a container 93 containing an $SF_6$ gas, an accelerating tube 94, a scanning device 95 and others, which are arranged in this order from the higher side to the lower side. Under these parts, it includes a triangular scanning tube 96 and a gold ring 97. A vacuum is formed in the scanning tube 96. At the bottom, there is arranged a titanium foil 98, which is required for maintaining a vacuum in the scanning tube 96. Electron rays pass through the titanium foil 98 into an environmental space, which is filled with a nitrogen gas. The deposition target object S moves immediately under the scanning tube 96. During this movement, the electron rays are irradiated on the deposition surface of the object.

FIG. 12 shows an operation of irradiating electron rays which is controlled through a console panel 101. A DC power source 102 supplies a high DC voltage to the electron ray irradiating device 9 through the cable 91. The DC current heats a filament to generate electrons. Electrons are issued toward the accelerating tube 94 owing to a difference between vertically applied voltages. A plurality of electrodes and insulators are arranged in the accelerating tube for accelerating electrons by the DC voltage. The accelerated electron beams are scanned by the scanning device 95 in a two-dimensional or one-dimensional manner.

The scanning is performed by periodically swinging the electron rays by an alternating magnetic field. A conveyor 99 is arranged immediately under the scanning tube 96 (scanner) for conveying the deposition target object. By irradiation of the electron rays, crosslinking occurs at the deposition surface made of polymer material such as rubber or resin, so that a large number of uncombined atoms appear at the surface. In the example shown in FIG. 12, the deposition surface is made of polyethylene. The irradiation causes crosslinking between molecules forming fibers. The irradiation of electron rays on resin for causing crosslinking is a well-known technique. In this embodiment, the irradiation of electron rays is performed for producing a large number of uncombined atoms. This improves the adhesion property of the carbon film (typically, DLC film).

The pretreatment may be performed with either or both of the ultraviolet rays and electron rays.

After the first pretreatment, in which ultraviolet rays and/or electron rays are irradiated on the deposition surface, the second pretreatment may be performed by exposing the deposition surface to the plasma of fluorine-containing gas or hydrogen gas.

In any case, the carbon film can be deposited on the deposition surface of the object by the plasma CVD apparatus in one of FIGS. 1 to 9 after the above pretreatment(s). Depending on the plasma CVD apparatus and plasma CVD method which are actually employed, advantages peculiar to them can be achieved. For example, the apparatuses and methods in FIGS. 3 to 9 can provide the carbon films having a good adhesion property.

When the plasma CVD apparatus is used for depositing the carbon film, the above second pretreatment can be performed by the same plasma CVD apparatus.

Description will now be given on experimental examples 4-1 to 4-8 for depositing DLC films after the above first and/or second pretreatments and comparative experimental examples 4-1 and 4-2 for depositing DLC films. In these experimental examples, each test piece had a size of 1 mm×100 mm×1 mm (thickness) and was made of polyethylene sheet, and the plasma CVD apparatus shown in FIG. 1 was used.

The first pretreatment (Pretreatment 1) and the second pretreatment (Pretreatment 2), and thin-film forming methods experimental examples (EX) and comparative experimental examples (CE).

|        | Pretreatment 1 with ultraviolet/ electron rays | Pretreatment 2 plasma processing | Film Forming Method |
|--------|------------------------------------------------|----------------------------------|---------------------|
| CE 4-1 | no                                             | no                               | plasma CVD          |
| EX 4-1 | ultraviolet rays                               | no                               | plasma CVD          |
| EX 4-2 | electron rays                                  | no                               | plasma CVD          |
| EX 4-3 | ultraviolet rays                               | $H_2$                            | plasma CVD          |
| EX 4-4 | ultraviolet rays                               | $SF_6$                           | plasma CVD          |
| EX 4-5 | ultraviolet rays                               | $H_2/SF_6$                       | plasma CVD          |
| EX 4-6 | ultraviolet rays                               | $H_2$                            | plasma CVD          |
| EX 4-7 | ultraviolet rays                               | $SF_6$                           | plasma CVD          |
| EX 4-8 | ultraviolet rays                               | $H_2/SF_6$                       | plasma CVD          |
| CE 4-2 | no                                             | no                               | no                  |

In the comparison example 4-1, a DLC film was deposited on a polyethylene sheet by the plasma CVD method without a pretreatment. In the comparison example 4-2, the object was a sheet itself not coated with a thin film.

In the experimental example 4-1, a DLC film was formed by the CVD method after irradiation of ultraviolet rays. In the experimental example 4-2, a DLC film is formed by the plasma CVD method after irradiation of electron rays.

In the experimental examples 4-3 and 4-6, film deposition was performed after irradiation of ultraviolet rays and hydrogen gas plasma processing. In the experimental examples 4-4 and 4-7, DLC films were formed after irradiation of ultraviolet rays and $SF_6$ plasma processing. In the experimental examples 4-5 and 4-8, DLC films were formed after irradiation of ultraviolet rays as well as processing with hydrogen plasma and SF6 plasma.

[A. Ultraviolet Ray Irradiating Conditions]

The experimental examples 4-1 and 4-3 to 4-8 employed the same ultraviolet ray irradiating conditions.

| | |
|---|---|
| Ultraviolet Intensity: | 15 mw/cm$^2$ ($\lambda$ = 254 nm) |
| Irradiation distance: | 10 mm |
| Irradiation time: | 100 seconds |
| Irradiation area: | 200 mm × 200 mm |

[B. Electron Ray Irradiating Conditions]
(Pretreatment Conditions of Experimental Example 4-2)

| | |
|---|---|
| Acceleration voltage: | 200 keV |
| Electron ray current: | 100 mA |
| Irradiation time: | 30 seconds |
| Scanning width: | 450 mm |

[C. Hydrogen Gas Plasma Processing Conditions]

All the experimental examples 4-3, 4-5, 4-6 and 4-8 employed the same conditions.

| | |
|---|---|
| Pretreatment gas: | hydrogen gas (H$_2$), 100 sccm |
| RF power: | 13.56 MHz, 300 W |
| Degree of vacuum: | 0.1 Torr |
| Processing time: | 10 minutes |

[D. Fluorine Compound Gas Plasma Processing Conditions]

All the experimental examples 4-4, 4-5, 4-7 and 4-8 employed the same conditions.

| | |
|---|---|
| Pretreatment gas: | sulfur hexafluoride (SF$_6$), 100 sccm |
| RF power: | 13.56 MHz, 300 W |
| Degree of vacuum: | 0.1 Torr |
| Processing time: | 10 minutes |

[E. Conditions of Plasma CVD Thin Film Formation]

All the experimental examples 4-1 to 4-8 and the comparative example 4-1 employed the same conditions.

| | |
|---|---|
| Size of RF electrode: | 280 mm in diameter |
| Material gas: | methane (CH$_4$), 100 sccm |
| RF power: | 13.56 MHz, 300 W |
| Degree of vacuum: | 0.1 Torr |
| Deposition rate: | 50 nm/min (500 Å/min) |
| Processing time: | 10 minutes |

Under the conditions C, D and E, the sheets were heated by collision of plasma against polyethylene sheets. The temperature controller 21 kept the temperature of the sheet at about 80° C. The controller 21 prevents rising of temperature above 150° C.

Measured results of friction coefficients (F/CF), wear properties (W/PR), film adhesion properties (A/PR) and rates (R/UA) of uncombined atoms at surface in experimental examples and comparative experimental examples.

| | F/CF | W/PR ($\mu$m) | A/PR | R/UA (%) |
|---|---|---|---|---|
| CE 4-1 | 1.5 | 0.9 | 2 | 0 |
| EX 4-1 | 1 | 0.7 | 3 | 10 |
| EX 4-2 | 1 | 0.7 | 3 | 20 |
| EX 4-3 | 1 | 0.5 | 4 | |
| EX 4-4 | 1 | 0.5 | 4 | |
| EX 4-5 | 1 | 0.5 | 5 | |
| EX 4-6 | 1 | 0.4 | 4 | |
| EX 4-7 | 1 | 0.4 | 4 | |
| EX 4-8 | 1 | 0.4 | 5 | |
| CE 4-2 | 3 | 2.3 | — | 0 |

The friction coefficient was determined by measuring resistances applied to an aluminum pin which bore a load of 10 grams and moved at a speed of 20 mm/sec. The wear property was determined by measuring a depth of worn portion after a diamond pin bearing a load of 10 grams was moved at a speed of 20 mm/sec for one hour. The rate of uncombined atoms at the object surface was measured by an energy loss spectrum analyzer (EELS). This rate was represented by a rate in number of atoms having dangling bonds with respect to all the carbon atoms existing at the surface. Irradiation of ultraviolet rays and electron rays increase the number of uncombined carbon atoms. These atoms are strongly joined to the component of the DLC film, so that peeling of the film is suppressed.

In all the experimental examples, the friction coefficients are not larger than 1, which means a good sliding property. A machine part or the like may have a contact surface coated with the carbon film for contact with another object. This machine part allows a smooth operation even after a long-term use. The objects had wear property values of 0.7 or less, which clearly proves a good resistance against wear.

All the experimental examples exhibited good adhesion properties, so that the films could not be peeled off even when the rubber sheets were folded, bent and/or expanded. The experimental examples 4-5 and 4-8 exhibited particularly high adhesion properties, because these examples employed two kinds of processing, i.e., hydrogen plasma processing and $SF_6$ plasma processing.

Description will now be given on examples of objects each having a portion to be in contact with another object (another good, part, fluid, ground, human body or the like). The portion is made of at least one kind of material selected from a group including polymer material such as resin or rubber as well as glass. The portion has a surface entirely or partially coated with a carbon film having a wear resistance as well as at least one of a lubricity, a water repellency and a gas barrier property. The carbon films of the objects to be described below can be formed by various kinds of plasma CVD apparatuses and methods already described, and have distinctive advantages, respectively. The carbon films may be formed by the ion-plating method or the sputtering method. The plasma CVD method allows deposition of the carbon film at a relatively low temperature, and therefore is advantageous for deposition of the carbon film on the object having an insufficient thermal resistance. All the carbon films F on the objects to be described below are DLC films, although not restricted thereto.

Figure 13A:
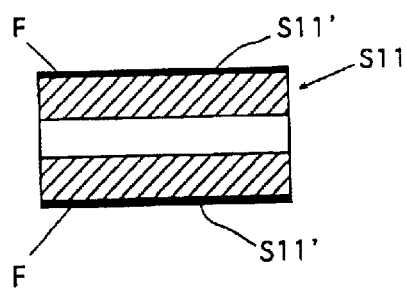
FIGS. 13(A) through 13(H) are cross sections or side view (only FIG. 13(E)) showing objects for an automobile, and particularly showing a vibration damper, a hose, a tire, a diaphragm, a valve part (valve member), a seal member, window pane and a body part, respectively.

FIG. 13(A) shows a vibration damper for an automobile, which is formed of a base member or substrate S11 entirely or primarily made of rubber and having an outer peripheral surface S11' entirely coated with the carbon film F.

Figure 13B:
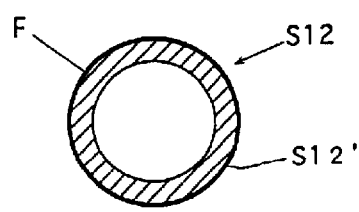

FIG. 13(B) shows an automobile hose, which is formed of a hose base member S12 entirely or primarily made of rubber and having an outer peripheral surface S12' entirely coated with the carbon film F.

Figure 13C:
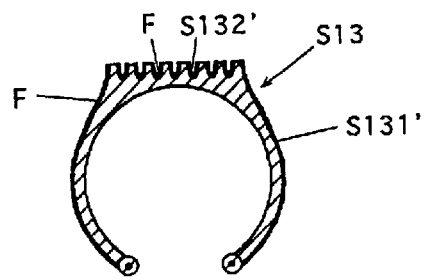

FIG. 13(C) shows an automobile tire, in which the carbon film F is formed at an outer surface S131' of a tire body S13 including a portion to be in contact with a metal wheel fitted into the tire and portions to be in contact with rainwater and mud and inner surfaces S132' of grooves at the outer peripheral surface. The carbon film F is not formed at the outer peripheral surface exposed to a road surface. For forming the portion of the tire not coated with the carbon film, this portion is masked during the carbon film formation processing, or the carbon film temporarily deposited on this portion is removed by polishing or the like.

Figure 13D:
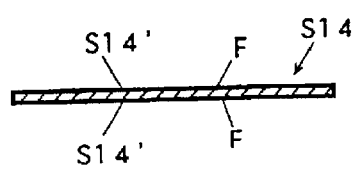

FIG. 13(D) shows a diaphragm for an automobile diaphragm pump, which includes a diaphragm base member S14 entirely or primarily made of rubber and the carbon films F coated over opposite surfaces S14' of the body S14.

Figure 13E:
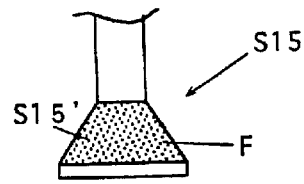
Figure 13F:
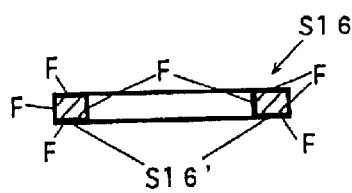

FIG. 13(E) shows an example of an automobile valve part and more specifically a valve body, in which a valve body substrate S15 is made of resin and has a contact portion to be in contact with a valve seat (not shown), and the carbon film F is deposited on a surface S15' of the contact FIG. 13(F) shows an example of an automobile seal member and more specifically an annular seal member, in which a seal base member S16 is entirely or primarily made of rubber or resin and the carbon film F is formed on an entire surface S16' including inner and outer peripheral surfaces and opposite side surfaces.

Figure 13G:
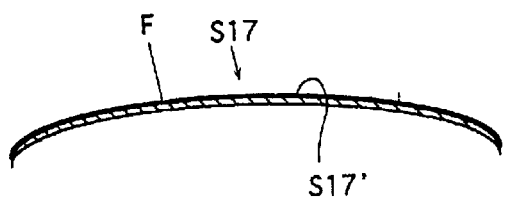

FIG. 13(G) shows an example of an automobile window pane and more specifically a wind screen, in which the carbon film F is formed entirely on an outer surface S17' of a base glass S17. The thickness of the film F allows that a driver see outside through the film.

Figure 13H:
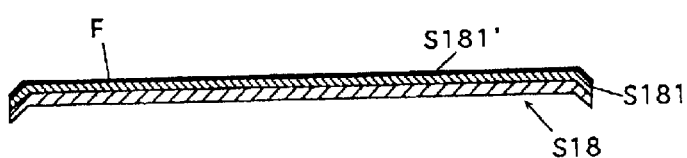

FIG. 13(H) shows an automobile body and particularly an example of its part, in which the carbon film F is deposited entirely on an outer surface S181' of a paint film S181 at a surface of the body S18 made of resin or metal. The carbon film has a thickness which sufficiently allows external display of color of the paint film.

As can be understood from the experimental examples and comparative experimental examples already described, the vibration damper, valve part and seal member for the automobile can provide a good lubricity and a good wear resistance at the portions coated with the DLC films, and also can provide a good sliding property at the coated portion, so that wear and deterioration can be suppressed. This allows a long-term use.

The automobile hose has a good lubricity, a good wear resistance and a good gas barrier property, and also has a good sliding property with respect to another object such as a hose fastener, so that wear and deterioration can be suppressed. These factors allow a long-term use. Further, transmission between the interior and the exterior of the hose wall can be suppressed owing to a good gas barrier property.

In the automobile tire, the portion coated with the DLC film can exhibit a good lubricity, a good wear resistance, a good gas barrier property and a good water repellency. Therefore, it can smoothly slide on the other object, and wear and deterioration due to contact with the wheel can be suppressed. Also, deterioration of the portion exposed to the external light and exhaust gas can be suppressed. Owing to the gas barrier property of the DLC film, it is possible to suppress transmission of water vapor between the exterior and the interior of the tire, and it is also possible to prevent deterioration of a tube, if arranged inside the tire. A carbon film such as a DLC film may be formed on the inner surface of the tire for suppressing deterioration of the tube. Owing to the water repellency, the DLC film can suppress remaining of water and mud in the tire grooves in the rain.

In the automobile diaphragm, the portion provided with the DLC film has a good wear resistance and a good water repellency, and therefore is suppressed from damage due to contact with another object such as a diaphragm fastener, so that the diaphragm can be used for a long term. It is also possible to suppress adhesion of liquid handled by the pump to the surface coated with the DLC film.

In the automobile body, the portion coated with the DLC film has a good wear resistance and a good water repellency, so that the coated paint film can be suppressed from damage, and raindrops and dust on the paint film can be easily washed away.

In the automobile wind pane, the portion coated with the DLC film have a good wear resistance and a good water repellency, so that the coated portion can be suppressed from being scratched by sand dust and other. Also, it is possible to suppress raindrops and dust from remaining on the pane, and raindrops and dust on the pane can be easily washed away.

Figure 14A:
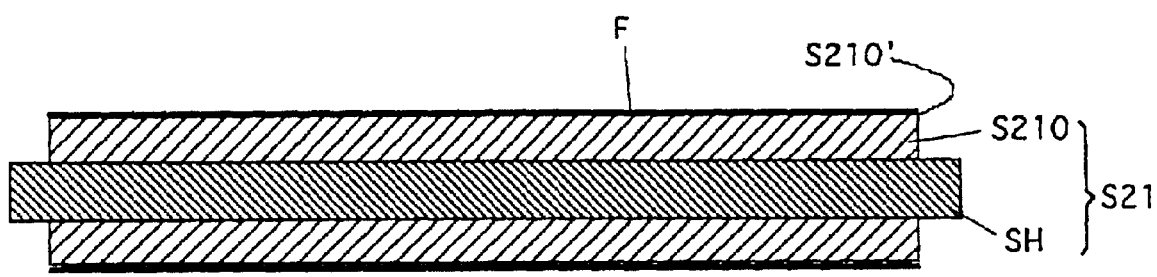
FIGS. 14(A) and 14(B) show parts of an image forming apparatus of an embodiment of the invention, and are a cross section showing a roller and a side view showing a part of gear, respectively.

FIG. 14(A) shows an example of a part of an image forming apparatus, and more specifically shows a roller having a structure which can be employed in a pressure roller or the like in a fixing device. In this example, a rubber layer S210 is formed around a shaft SH, and the carbon film F is formed entirely on an outer peripheral surface S21, of the rubber layer S210.

Figure 14B:
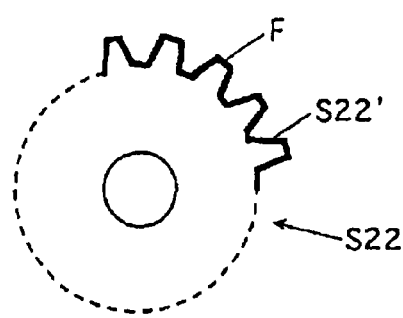

FIG. 14(B) shows a gear which is another example of a part of an image forming apparatus. In the example, the carbon film F is formed entirely on a tooth surface S21' of a gear base member S22 made of resin.

The above rollers and gears have contact surfaces to be brought into contact with a record member, a roller or another gear. Since these contact surfaces are coated with the DLC films, a good lubricity and a good wear resistance are achieved, so that wear and deterioration are suppressed and they can be used for a long term. Characteristics of the carbon film do not change even if it is exposed to a temperature of about 200° C. in the fixing device.

Figure 15A:
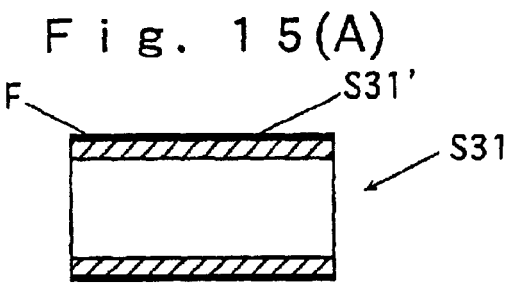
FIGS. 15(A) through 15(E) show objects of embodiments of the invention, and are cross sections showing a machine part, i.e., a guide roller, a water pump portion in a water pistol, a sheet, wall member and a pipe, respectively.

FIG. 15(A) shows an example of a machine part other than those already described, and more specifically shows a guide roller in which the carbon film F is formed entirely on an outer peripheral surface S31' of a cylindrical roller base body S31 made of resin.

Figure 15B:
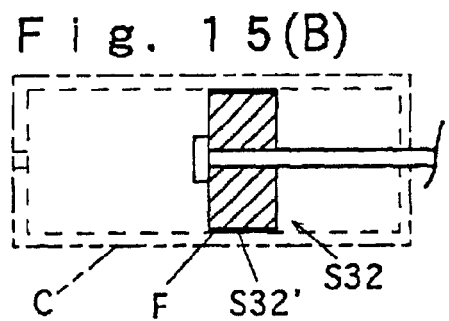

FIG. 15(B) shows an example of a toy and more specifically a water pump portion in a water pistol. In this example, the carbon film F is formed entirely on an outer peripheral surface S32' of a piston S32 made of rubber and slidably fitted into a cylinder C.

Figure 15C:
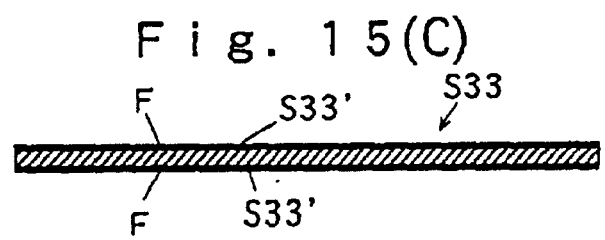

FIG. 15(C) shows an example of a sheet for general purpose use. In this example, the carbon film F is formed on opposite side surfaces S33, of a sheet base member S33 primarily made of resin.

Figure 15D:
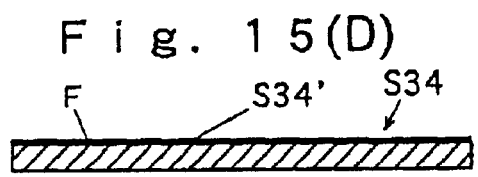

FIG. 15(D) shows an example of a structure component part and more specifically a wall member. In this example, the carbon film F is formed on a surface S34' of a wall base member S34 primarily made of resin.

Figure 15E:
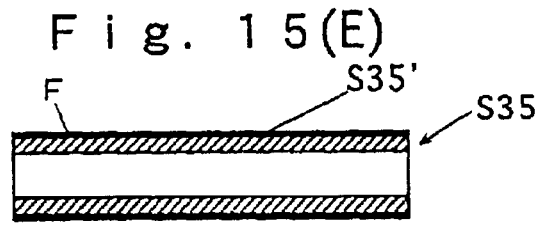

FIG. 15(E) shows a pipe for general purpose use, in which the carbon film F is formed on an outer peripheral surface S351 of a pipe base member S35 made of resin.

In the guide roller, the piston of the water pistol and the wall member, the portions coated with the DLC films have a good lubricity and a good wear resistance, and can provide a good sliding property with respect to other so that wear and deterioration can be suppressed, and a long-term use is allowed.

Since the DLC films have a water repellency, these objects are suppressed from damage and deterioration due to contact with water.

In the sheet described above, the portion coated with the DLC film has a good lubricity, a good wear resistance and a good water repellency. Therefore, the sheet can provide a good sliding property with respect to other objects, and wear and deterioration are suppressed. For these reasons, the sheet can be used for a long term. Owing to the water repellency of the DLC film, adhesion of waterdrops, raindrops and mud can be suppressed.

The pipe described above has a good lubricity, a good wear resistance and a good gas barrier property, so that it exhibits a good sliding property with respect to another object, and wear and deterioration are suppressed. Owing to these reasons, the pipe can be used for a long term. The gas barrier property of the pipe suppresses transmission of a gas between the exterior and the interior of the pipe.

Figure 16A:
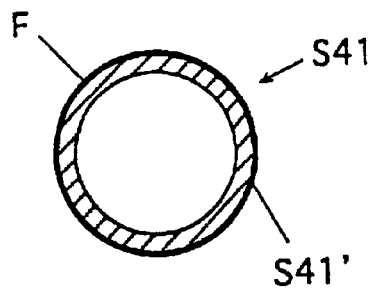
FIGS. 16(A) through 16(E) show parts of embodiments of the invention, and are a cross section of a ball, a side view of a disk used as a substitute for spokes in a bicycle, a side view of a boot, a cross section of a diaphragm for a diaphragm pump and a frame of a tennis racket, respectively.

FIG. 16(A) shows an example of a sport article and more specifically a ball, in which the carbon film F is formed over an outer peripheral surface S41' of a ball base member S41 entirely or primarily made of rubber or resin.

Figure 16D:
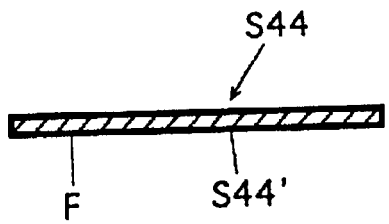
Figure 16B:
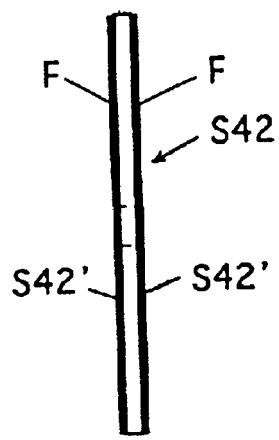

FIG. 16(B) shows an example of a bicycle part and more specifically a wheel disk employed as a substitute of spokes, in which the carbon films F are formed on opposite side surfaces S42' of a disk base member S42.

Figure 16E:
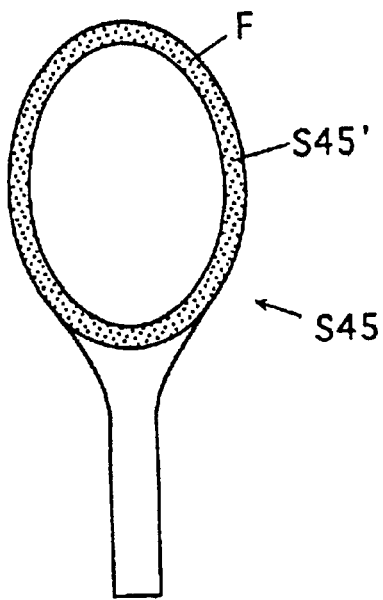
Figure 16C:
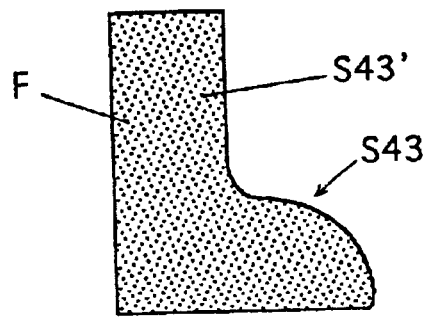

FIG. 16(C) shows an example of a rain article and more specifically a rain boot, in which the carbon film F is formed on a whole surface S43' of a boot base body S43 except for a portion of a bottom in contact with a ground.

FIG. 16(D) shows a diaphragm employed in a diaphragm pump other than the automobile diaphragm pump. In this diaphragm the carbon films F are formed on opposite side surfaces S44' of a diaphragm base member S44 entirely or primarily made of rubber.

FIG. 16(E) shows a frame of a tennis racket, in which the carbon film F is formed on a whole surface S45' of a portion of a frame base member S45 made of resin. This portion supports guts.

The portions coated with the DLC films in the ball, the wheel disk and the racket frame described above have a good lubricity, a good wear resistance and a good water repellency. Therefore, these portions exhibit a good sliding property with respect to other objects, and wear and deterioration are suppressed. Therefore, they can be used for a long term. Owing to the water repellency of the DLC film, adhesion of raindrops, mud and others can be suppressed when used in the rain.

By The boot described above has a good wear resistance and a good water repellency at its portion coated with a DLC film, and the coated portion can be suppressed from damage due to contact with other objects, so that it can be used for a long term, and adhesion of raindrops and mud is suppressed.

The diaphragm described above has a good wear resistance and a good water repellency at its portion coated with a DLC film, and the coated portion is suppressed from damage due to contact with another object such as a diaphragm fastener, so that it can be used for a long term, and liquid handled by the pump can be suppressed from adhering to the coated portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A machine part selected from a group including a vibration damper for an automobile, a sealing member for an automobile, and a rotary member for an image forming apparatus, having a portion to be in contact with another object, said portion being made of an organic polymer material selected from a group including resin and rubber, and said portion having a flexible surface entirely or partly coated with a DLC (diamond like carbon) film having a wear resistance and a lubricity as well as a thickness exhibiting flexibility substantially conforming to the flexibility of the surface of said portion.

2. A machine part selected from a group including a hose, a sealing member, and a sheet, each employed in a machine, and having a portion to be in contact with another object, said portion being made of an organic polymer material selected from a group including resin and rubber, and said portion having a flexible surface entirely or partly coated with a DLC (diamond like carbon) film having a wear resistance and a lubricity as well as a gas barrier property and having a thickness exhibiting flexibility substantially conforming to the flexibility of the surface of said portion.

3. A diaphragm of a diaphragm pump employed in a machine having a portion to be in contact with a liquid, said portion being made of an organic polymer material selected from a group including resin and rubber, and said portion having a flexible surface entirely or partly coated with a DLC (diamond like carbon) film having a wear resistance and a water repellency as well as a thickness exhibiting flexibility substantially conforming to the flexibility of the surface of said portion.

4. A wiper blade employed in a machine and having a portion to be in contact with water and a window pane of the machine, said portion being made of an organic polymer material selected from a group including resin and rubber, and said portion having a flexible surface entirely or partly coated with a DLC (diamond like carbon) film having a wear resistance and a lubricity as well as a water repellency, and having a thickness exhibiting flexibility substantially conforming to the flexibility of the surface of said portion.

* * * * *